US010444492B2

(12) United States Patent
Hopkins et al.

(10) Patent No.: US 10,444,492 B2
(45) Date of Patent: Oct. 15, 2019

(54) FLEXURE-BASED, TIP-TILT-PISTON ACTUATION MICRO-ARRAY

(71) Applicants: Jonathan Hopkins, Palo Alto, CA (US); Robert Matthew Panas, Westborough, MA (US)

(72) Inventors: Jonathan Hopkins, Palo Alto, CA (US); Robert Matthew Panas, Westborough, MA (US)

(73) Assignee: Lawrence Livermore National Security, LLC, Livermore, CA (US)

( * ) Notice: Subject to any disclaimer, the term of this patent is extended or adjusted under 35 U.S.C. 154(b) by 1056 days.

(21) Appl. No.: 14/218,970

(22) Filed: Mar. 19, 2014

(65) Prior Publication Data

US 2018/0180872 A1 Jun. 28, 2018

Related U.S. Application Data

(60) Provisional application No. 61/847,004, filed on Jul. 16, 2013.

(51) Int. Cl.
*G02B 26/00* (2006.01)
*G02B 26/08* (2006.01)
*B81B 3/00* (2006.01)

(52) U.S. Cl.
CPC ........ *G02B 26/0841* (2013.01); *B81B 3/0062* (2013.01); *B81B 2201/033* (2013.01); *B81B 2203/053* (2013.01); *B81B 2203/058* (2013.01)

(58) Field of Classification Search
CPC .............. G02B 26/0841; G02B 26/085; G02B 26/0858; G02B 26/033; G02B 26/101;
(Continued)

(56) References Cited

U.S. PATENT DOCUMENTS

2008/0130090 A1* 6/2008 Aubuchon ......... G02B 26/0841
359/291
2010/0001616 A1* 1/2010 Ferreira ................ H02N 1/008
310/300

(Continued)

OTHER PUBLICATIONS

McInroy, et al., "Dynamic Modeling of Flexure Jointed Hexapods for Control Purposes", IEEE International Conference on Control Applications, pp. 508-513 (Aug. 22-27, 1999).

(Continued)

*Primary Examiner* — Mustak Choudhury
(74) *Attorney, Agent, or Firm* — James S. Tak

(57) ABSTRACT

A flexure-based micro-array having a plurality of micro-assemblies, each comprising: an object; and at least three electrostatic actuation modules for tipping, tilting, and/or piston-actuating the object, each actuation module comprising: a base with first and second electrodes electrically isolated from each other; an electrically conductive lever arm; a first flexure bearing suspending the lever arm adjacent the first and second electrodes so that electrical activation of at least one of the first and second electrodes produces an electrostatic moment of force on the lever arm to resiliently bias the first flexure bearing and pivot the lever arm about a fulcrum; and a second flexure bearing connecting the lever arm to the object at a connection location that is different from other connection locations of the other actuation modules so that pivoting the lever arm about the fulcrum induces the second flexure bearing to pivot the object about an object pivot axis defined between two of the other connection locations while the second flexure bearing decouples the lever arm from object displacements induced by two of the other actuation modules connected to the two other connection locations defining the object pivot axis, wherein the plurality of micro-assemblies are arranged with the objects juxtaposed in a substantially 2D array.

24 Claims, 30 Drawing Sheets

(58) Field of Classification Search
CPC .............. G02B 26/105; G02B 26/0816; G02B 26/0825; G02B 26/0833; G02B 26/06; G02B 7/182; B81B 3/0083; B81B 3/0086; B81B 2203/04; G09G 3/3433
USPC ......... 359/198.1–199.4, 200.6–200.8, 202.1, 359/221.2, 223.1–225.1, 226.2, 245, 359/290–295, 838, 846, 871, 872, 904; 310/300, 309; 250/204, 559.06, 559.29, 250/230, 234; 347/255–260; 353/39, 353/98–99; 385/15–18, 22; 398/12, 19, 398/45; 381/104, 182, 190, 191; 361/234
See application file for complete search history.

(56) References Cited

U.S. PATENT DOCUMENTS

| | | | |
|---|---|---|---|
| 2013/0121509 A1* | 5/2013 | Hsu | H04R 19/005 381/104 |
| 2014/0192397 A1* | 7/2014 | Atnip | B81C 1/00642 359/291 |

OTHER PUBLICATIONS

Bernstein, et al., "Two Axis-of-Rotation Mirror Array Using Electromagnetic MEMS", IEEE, pp. 275-273 (2003).
Yang, "A Novel Coil-less Lorentz Force 2D Scanning Mirror Using Eddy Current", MEMS Institute, IEEE, pp. 774-777 (Jan. 2006).
Castelino, et al., "MEMS-Based Low-Power Portable Vector Display", Adriatic Research Institute, 2 pages, undated.
McCormick, et al., "A MEMS Based Optical Coherence Tomography Imaging System and Optical Biopsy Probes for Real-Time, High Resolution In-Vivo and In-Vitro 2-D or 3-D Imaging", Berkeley Sensor and Actuator Center, 2 pages, undated.
Milanovic, et al., "Fully-Functional Tip-Tilt-Piston Micromirror Array", Adriatic Research Institute, 2 pages, undated.
Milanovic, et al., "Highly Adaptable MEMS-Based Display with Wide Projection Angle", Adriatic Research Institute, 4 pages, undated.
Milanovic, et al., "Fast and High-Precision 3D Tracking and Position Measurement with MEMS Micromirrors", Mirrorcle Technologies, Inc., 2 pages, undated.
Milanovic, "Improved Control of the Vertical Axis Scan for MEMS Projection Displays", Adriatic Research Institute, 2 pages, undated.
Last, et al., "Towards a 1 mm Camera—The Field Stiching Micromirror", Berkeley Sensor and Actuator Center, 2 pages, undated.
Milanovic, et al., "Torsional Micromirrors with Lateral Actuators", Transducers 01, Muenchen, Germany, 4 pages, Jun. 2001.
Milanovic, et al., "Monolithic Silicon Micromirrors with Large Scanning Angle", Adriatic Research, 2 pages, undated.
Kwon, et al., "Vertical Microlens Scanner for 3D Imaging", Technical Digest of the 2002 Solid-State Sensor and Actuator Workshop, 4 pages, 2002.
Milanovic, et al., "Monolithic Vertical Combdrive Actuators for Adaptive Optics", IEEE Optical MEMS 2002. 2 pages, Aug. 2002.
Kwon, et al, "A High Aspect Ratio 2D Gimbaled Microscanner with Large Static Rotation", IEEE/LEOS Optical MEMS 2 pages, Aug. 2002.
Millanovic, "Multilevel Beam SOI-MEMS for Optical Applications", Int. Cont. on Electronics Circuits and Systems, 5 pages, Sep. 2002.
Millanovic, et al., "Monolithic High Aspect Ratio Two-Axis Optical Scanners in SOI", 16th IEEE Int Microelectromechanical Systems Cont., 4 pages, Jan. 2003.
Zhou, et al., "Two-Axis Scanning Mirror for Free-Space Optical Communication Between UAVs", IEEE/LEOS Optical MEMS, 2 pages, Aug. 2003.
Milanovic, "Laterally Acuated Torsional Micromirrors for Large Static Deflection", IEEE Photonics Technology Letters, vol. 15, No. 2, 3 pages, Feb. 2003.
Millanovic, "Multilevel Beam SOI-MEMS Fabrication and Applications", Journal of Microelectricalmechanical Systems, vol. 13, No. 1, 12 pages, Feb. 2004.
Kwon, et al, "Vertical Combdrive Based 2-D Gimbaled Micromirrors with Large Static Rotation by Backside Island Isolation", IEEE Journal of Selected Topics in Quantum Electronics, vol. 10, No. 3, 7 pages, Jun. 2004.
Milanovic, et al., "Gimbal-Less Monolithic Silicon Actuators for Tip-Tilt-Piston Micromirror Applications", IEEE Journal of Selected Topics in Quantum Electronics, vol. 10, No. 3, 10 pages, May/Jun. 2004.
Milanovic, et al., "Tip-Tilt-Piston Actuators for High-Fill-Factor Micromirror Arrays", Solid-State Sensor, Actuator and Microsystems Workshop, 5 pages, Jun. 6-10, 2004.
Milanovic, et al., "Hight Aspect Ratio Micromirrors with Large Static Rotation and Piston Actuation", IEEE Photonics Technology Letters, vol. 16, No. 8, 3 pages, Aug. 2004.
Milanovic, et al., "Sub-100 us Settling Time and Low Voltage Operation for Gimbal-less Two-Axis Scanners", IEEE/LEOS Optical MEMS 2004, 2 pages, 2004.
Adriatic Research Institute, "Gimbal-Less Two-Axis Scanning Micromirrors—B Series", 5 pages, 2006.
Adriatic Research Institute, "Gimbal-Less Two-Axis Scanning Micromirrors—M Series", 4 pages, 2006.
Adriatic Research Institute, "Gimbal-Less Two-Axis Scanning Micromirrors" 2 pages, 2006.
Adriatic Research Institute, "Gimbal-Less Two-Axis Scanning Micromirrors—L Series", 5 pages, 2006.
Milanovic, "Linearized Gimbal-less Two-Axis MEMS Mirrors", 2009 Optical Fiber Communication Conference and Exposition, 6 pages, 2009.

* cited by examiner

FLEXURE-BASED, TIP-TILT-PISTON ACTUATION MICRO-ARRAY

FEDERALLY SPONSORED RESEARCH OR DEVELOPMENT

The United States Government has rights in this invention pursuant to Contract No. DE-AC52-07NA27344 between the United States Department of Energy and Lawrence Livermore National Security, LLC for the operation of Lawrence Livermore National Laboratory.

TECHNICAL FIELD

The present invention is generally directed to independently actuated micro-arrays, and more particularly to a flexure-based, tip-tilt-piston actuation micro-array for controlling motion of an array of objects such as micro-mirrors which are flexure-supported and/or flexure-actuated to inhibit parasitic motion.

BACKGROUND

Tip/tilt/piston (TTP) micro-mirror arrays are known for their ability to simultaneously direct multiple beams of light in various directions at high speeds (kHz), and have been used for various applications, including for example optical routing/cross-connects, image projection, object tracking, adaptive optics for aberration correction and laser scanning/steering. And existing micro-mirror designs exhibit a wide range of mirror scales and discrete/continuous configurations, actuation physics/designs, and bearing designs, with the actuation physics typically setting bounds on the speed of mirror actuation, while the discrete or continuous surface design of the mirror configuration often placing range restrictions on the mirror motions.

One example type is a Lorentz-actuated micro-mirror array using magnets and coils [10] provided as conductive traces on each mirror for directly controlling mirror motion. The Lorentz energy densities, however, are typically low (e.g. in the range of ≈10-100 pJ/mm$^3$), resulting in slower (e.g. <1 kHz) stepping rates. In addition, such Lorentz actuated mirror designs often use a gimbaled mirror, which allows for tip/tilt motion, often to large angles (150) but with the drawback of poor dynamics and with reduced fill factor (i.e. low directed light) below acceptable levels due to the intermediary structure.

Electrostatic actuators are also used in micro-mirror arrays, as it produces relatively high forces without significant dynamics or heating problems. Capacitive comb drives are known to exhibit some of the highest force densities measured due to the ability to pack combs very efficiently. This produces very fast mirrors, but with the necessity of decoupled actuation for multi-axis designs, as the combs must only move in the prescribed, often 1 DOF, motion to avoid snap in. This results in more complex designs, often utilizing transmissions. Capacitive parallel plate drives offer a tradeoff of lower forces (and thus slower mirrors) but with significant reduction in device complexity due to the simpler actuator geometry and the ability to do direct multi-axis actuation without transmissions.

Continuous plate devices are designed specifically for wavefront phase modulation, and typically use parallel plate or pizeo arrayed actuation. The continuous reflective surface allows for spatially smooth adjustment of beam phase in-between actuation points, however it limits net tip/tilt of the mirror to generally well below 1, strongly limiting their utility beyond aberration correction.

Thermal devices have been shown to produce extremely large range motion (90°) due to the generation of thermal stress in the mirror flexural bearing. This is done through Ohmic heating of the bearings. This method generates two problems: structural warping due to heating and lower response rates, generally <2 kHz.

Piezo surface film devices (7) derive actuation effort through electrically induced surface stress on beams. This avoids the structural change due to thermal loading, allowing for greater stability. The nature of the piezo films as thin depositions limits the max voltage and thus the max force generation. This typically relegates piezo actuation to resonant or low speed devices. Piezos also suffer from a slow creep when operating in open loop conditions, making it difficult to generate precision motions.

What is needed therefore is a tip-tilt-piston micro-array capable of attaining high speeds over large ranges in all axes (i.e., tip/tilt/piston) to be accurately controllable for fine resolution mirror positioning, especially for use in demanding environments and applications, such as in light shield systems envisioned for bullet defeat applications, and in nano- and micro-fabrication systems.

SUMMARY

One aspect of the present invention includes a flexure-based micro-array comprising: a plurality of micro-assemblies, each comprising: an object; and at least three electrostatic actuation modules for tipping, tilting, and/or piston-actuating the object, each actuation module comprising: a base with first and second electrodes electrically isolated from each other, an electrically conductive lever arm; a first flexure bearing suspending the lever arm adjacent the first and second electrodes so that electrical activation of at least one of the first and second electrodes produces an electrostatic moment of force on the lever arm to resiliently bias the first flexure bearing and pivot the lever arm about a fulcrum; and a second flexure bearing connecting the lever arm to the object at a connection location that is different from other connection locations of the other actuation modules so that pivoting the lever arm about the fulcrum induces the second flexure bearing to pivot the object about an object pivot axis defined between two of the other connection locations while the second flexure bearing decouples the lever arm from object displacements induced by two of the other actuation modules connected to the two other connection locations defining the object pivot axis, wherein the plurality of micro-assemblies are arranged with the objects juxtaposed in a substantially 2D array.

Additionally other aspects of the present invention include, in addition to the flexure-based micro-array described above, any of the following:

1. The first flexure bearing comprises: a pair of blade flexures arranged along the fulcrum as torsion hinges connecting the lever arm to anchors fixed relative to the base; and stabilizing flexures connecting the anchors to the lever arm at off-axis locations from the fulcrum to additionally constrain the lever arm.

2. The second flexure bearing has a triangular truss-shape with a wide base connected to the lever arm and an apex connected to the object at the connection location. In particular, the second flexure bearing may comprise two wire flexures spaced from each other at the lever arm to form the wide base, and converging at the apex.

3. The second flexure bearing comprises an angled arm flexure having a first blade flexure horizontally cantilevered to the lever arm with a blade surface substantially orthogonal to the fulcrum, and a second blade flexure connected at one end to the first blade flexure and at an opposite end to the object at the connection location and with a blade surface substantially parallel to the fulcrum.

4. The lever arm has a first set of comb fingers on one of two lever arm sections divided by the fulcrum and a second set of comb fingers on the other one of the lever arm sections, and the first and second electrodes comprise comb fingers interdigitally positioned between the comb fingers of the first and second sets of comb fingers, respectively, of the lever arm. In particular, for each of the first and second sets of comb fingers of the lever arm, the comb fingers may be connected to adjacent comb fingers of the set across the finger ends. In the alternative, for each of the first and second sets of comb fingers of the lever arm, the comb fingers may be connected to adjacent comb fingers of the set across an opposite side of the lever arm from the base.

5. The object is a micro-mirror having a reflective surface with the actuation modules located on an opposite side thereof, and the plurality of micro-assemblies are arranged with the mirrors juxtaposed to form a substantially gapless micro-mirror array.

6. The object is a transmissive element for steering light transmitted therethrough by actuation of the lever arms.

7. The object has a hexagonal shape with each hexagonal side juxtaposed to a hexagonal side of an adjacent object to form a honeycomb-shaped micro-array.

8. The object has a body, and four blade flexures substantially co-planar to each other and peripherally extending from and alongside the body to respective anchor ends fixed relative to the base.

9. Each micro-device assembly comprises three electrostatic actuation modules connected to the object at three different connection locations, with the lever arm of each actuation module having a substantially rhombus shape in radial arrangement with the other two substantially rhombus-shaped lever arms so that major axes of the lever arms intersect at equal angles to each other, and the fulcrums are along the respective minor axes. Optionally, the object may be a hexagonal micro-mirror having a reflective surface with the actuation module located on an opposite side thereof, and the plurality of micro-assemblies are arranged so that each hexagonal side of the micro-mirror is juxtaposed to a hexagonal side of an adjacent micro-mirror to form a substantially gapless honeycomb-shaped micro-mirror array. Optionally, the first flexure bearing may comprise: a pair of blade flexures arranged along the fulcrum as torsion hinges connecting the lever arm to anchors fixed relative to the base; and stabilizing flexures connecting the anchors to the lever arm at off-axis locations from the fulcrum to additionally constrain the lever arm. Optionally, the second flexure bearing may have a triangular truss-shape with a wide base connected to the lever arm and an apex connected to the object at the connection location. Optionally, the second flexure bearing may comprise two wire flexures spaced from each other at the lever arm to form the wide base, and converging at the apex. And optionally, the lever arm may have a first set of comb fingers on one of two lever arm sections divided by the fulcrum and a second set of comb fingers on the other one of the lever arm sections, and the first and second electrodes comprise comb fingers interdigitally positioned between the comb fingers of the first and second sets of comb fingers, respectively, of the lever arm.

10. Each micro-assembly comprises four electrostatic actuation modules connected to the object at four different connection locations, with the lever arm of each actuation module having a substantially trapezoid shape arranged with the other three substantially trapezoid-shaped lever arms to form a square outline, and the fulcrums are parallel to and between the trapezoid bases of the respective lever arms. Optionally the object may be a square micro-mirror having a reflective surface with the actuation module located on an opposite side thereof and four blade flexures arranged substantially co-planar to each other and peripherally extending alongside the four sides of the micro-mirror to respective anchor ends fixed relative to the base, and the plurality of micro-assemblies are arranged so that each of the four sides of the square micro-mirror is juxtaposed to a side of an adjacent square micro-mirror to form a substantially gapless micro-mirror array. Optionally, the first flexure bearing may comprise: a pair of blade flexures arranged along the fulcrum as torsion hinges connecting the lever arm to anchors fixed relative to the base; and stabilizing flexures connecting the anchors to the lever arm at off-axis locations from the fulcrum to additionally constrain the lever arm. Optionally, the second flexure bearing may comprise an angled arm flexure having a first blade flexure horizontally cantilevered to the lever arm with a blade surface substantially orthogonal to the fulcrum, and a second blade flexure connected at one end to the first blade flexure and at an opposite end to the object at the connection location and with a blade surface substantially parallel to the fulcrum. And optionally, the lever arm may have a first set of comb fingers on one of two lever arm sections divided by the fulcrum and a second set of comb fingers on the other one of the lever arm sections, and the first and second electrodes comprise comb fingers interdigitally positioned between the comb fingers of the first and second sets of comb fingers, respectively, of the lever arm.

Another aspect of the present invention includes a flexure-based micro-actuation device comprising: an object; and at least three electrostatic actuation modules for tipping, tilting, and/or piston-actuating the object, each actuation module comprising: a base with first and second electrodes electrically isolated from each other; an electrically conductive lever arm; a first flexure bearing suspending the lever arm adjacent the first and second electrodes so that electrical activation of at least one of the first and second electrodes produces an electrostatic moment of force on the lever arm to resiliently bias the first flexure bearing and pivot the lever arm about a fulcrum; and a second flexure bearing connecting the lever arm to the object at a connection location that is different from other connection locations of the other actuation modules so that pivoting the lever arm about the fulcrum induces the second flexure bearing to pivot the object about an object pivot axis defined between two of the other connection locations while the second flexure bearing decouples the lever arm from object displacements induced by two of the other actuation modules connected to the two other connection locations defining the object pivot axis.

Another aspect of the present invention includes a flexure-based micro-array comprising: a plurality of micro-assemblies, each comprising: an actuator base having four electrode quadrants electrically isolated from each other, an object having four electrically conductive quadrants; and at least three blade flexures substantially co-planar to each other, and peripherally extending from and alongside the object to respective anchor ends fixed relative to the base for suspending the quadrants of the object adjacent the electrode quadrants of the actuator base, so that electrical activation of an electrode quadrant in a diametrically opposing pair of electrode quadrants displaces an adjacent quadrant of the body towards the electrically activated electrode quadrant, for tipping, and/or tilting the object, wherein the plurality of micro-assemblies are arranged with the objects juxtaposed in a 2D array.

Additionally other aspects of the present invention include, in addition to the flexure-based micro-array described above, any of the following:

1. The first flexure bearing comprises: a pair of blade flexures arranged along the fulcrum as torsion hinges connecting the lever arm to anchors fixed relative to the base; and stabilizing flexures connecting the anchors to the lever arm at off-axis locations from the fulcrum to additionally constrain the lever arm.

2. The second flexure bearing has a triangular truss-shape with a wide base connected to the lever arm and an apex connected to the object at the connection location. In particular, the second flexure bearing may comprise two wire flexures spaced from each other at the lever arm to form the wide base, and converging at the apex.

3. The second flexure bearing comprises an angled arm flexure having a first blade flexure horizontally cantilevered to the lever arm with a blade surface substantially orthogonal to the fulcrum, and a second blade flexure connected at one end to the first blade flexure and at an opposite end to the object at the connection location and with a blade surface substantially parallel to the fulcrum.

4. The lever arm has a first set of comb fingers on one of two lever arm sections divided by the fulcrum and a second set of comb fingers on the other one of the lever arm sections, and the first and second electrodes comprise comb fingers interdigitally positioned between the comb fingers of the first and second sets of comb fingers, respectively, of the lever arm. In particular, for each of the first and second sets of comb fingers of the lever arm, the comb fingers may be connected to adjacent comb fingers of the set across the finger ends. In the alternative, for each of the first and second sets of comb fingers of the lever arm, the comb fingers may be connected to adjacent comb fingers of the set across an opposite side of the lever arm from the base.

5. The object is a micro-mirror having a reflective surface with the actuation modules located on an opposite side thereof, and the plurality of micro-assemblies are arranged with the mirrors juxtaposed to form a substantially gapless micro-mirror array.

6. The object is a transmissive element for steering light transmitted therethrough by actuation of the lever arms.

7. The object has a hexagonal shape with each hexagonal side juxtaposed to a hexagonal side of an adjacent object to form a honeycomb-shaped micro-array.

8. The object has a body, and four blade flexures substantially co-planar to each other and peripherally extending from and alongside the body to respective anchor ends fixed relative to the base.

Another aspect of the present invention includes a flexure-based micro-actuation device comprising: an actuator base having four electrode quadrants electrically isolated from each other; an object having four electrically conductive quadrants; and at least three blade flexures substantially co-planar to each other, and peripherally extending from and alongside the object to respective anchor ends fixed relative to the base for suspending the quadrants of the object adjacent the electrode quadrants of the actuator base, so that electrical activation of an electrode quadrant in a diametrically opposing pair of electrode quadrants displaces an adjacent quadrant of the body towards the electrically activated electrode quadrant, for tipping, and/or tilting the object.

Another aspect of the present invention includes a flexure-based micro-array comprising: a plurality of micro-assemblies, each comprising: an object; a post cantilevered to the object; at least three blade flexures substantially co-planar to each other, and peripherally extending from and alongside the object to respective anchor ends; and four electrostatic actuation modules arranged in four quadrants for tipping, and/or tilting the object, each actuation module comprising: a base with an electrode electrically isolated from electrodes of other bases, and wherein the anchor ends of the blade flexures are fixed relative to the base; an electrically conductive shuttle; a first flexure bearing suspending the shuttle adjacent the electrode so that electrical activation of the electrode resiliently biases the first flexure bearing and displaces the shuttle in an opposite direction to shuttle displacement in a diametrically opposite quadrant and in an orthogonal direction to shuttle displacements in adjacent quadrants; and a second flexure bearing connecting the shuttle to the post so that displacing the shuttle induces the second flexure bearing to pull the post to pivot the object about a rotation axis orthogonal to the pulled direction, while the second flexure bearing decouples the shuttle from object displacements induced by the other actuation modules in adjacent quadrants, wherein the plurality of micro-assemblies are arranged with the objects juxtaposed in a substantially 2D array.

Additionally other aspects of the present invention include, in addition to the flexure-based micro-array described above, any of the following: 1. wherein each blade flexure comprises an inner segment connected to and extending alongside the object to an elbow end, and an outer segment connected to the inner segment at the elbow end and extending in parallel with the inner segment to the anchor end, 2. wherein each micro-assembly comprises four blade flexures connected to and peripherally extending from and alongside the object, 3. wherein the electrode quadrants and the quadrants of the object have a substantially trapezoid shape, 4. wherein the first flexure bearing comprises: a pair of blade flexures cantilevered to anchors fixed relative to the base. 5. wherein the electrodes and the shuttles have comb fingers, with the comb fingers of the electrodes interdigitally positioned between the comb fingers of adjacent shuttles, 6. wherein for each of the electrodes and the shuttles, the comb fingers are connected to adjacent comb fingers across the finger ends, 7. wherein for each of the electrodes and the shuttles, the comb fingers are connected to adjacent comb fingers across one side of the comb fingers, 8. wherein the object is a micro-mirror having a reflective surface with the actuation modules located on an opposite side thereof, and the plurality of micro-assemblies are arranged with the mirrors juxtaposed to form a substantially gapless micro-mirror array, 9. wherein the object is a transmissive element for steering light transmitted therethrough, and 10. wherein the object has a hexagonal shape with each hexagonal side juxtaposed to a hexagonal side of an adjacent object to form a honeycomb-shaped micro-array.

Another aspect of the present invention includes: a flexure-based micro-actuation device comprising: an object; a post cantilevered to the object; at least three blade flexures substantially co-planar to each other, and peripherally extending from and alongside the object to respective anchor ends; and four electrostatic actuation modules arranged in four quadrants for tipping, and/or tilting the object, each actuation module comprising: a base with an electrode electrically isolated from electrodes of other bases, and wherein the anchor ends of the blade flexures are fixed relative to the base; an electrically conductive shuttle; a first flexure bearing suspending the shuttle adjacent the electrode so that electrical activation of the electrode resiliently biases the first flexure bearing and displaces the shuttle in an opposite direction to shuttle displacement in a diametrically opposite quadrant and in an orthogonal direction to shuttle displacements in adjacent quadrants; and a second flexure bearing connecting the shuttle to the post so that displacing the shuttle induces the second flexure bearing to pull the post to pivot the object about a rotation axis orthogonal to the pulled direction, while the second flexure bearing decouples the shuttle from object displacements induced by the other actuation modules in adjacent quadrants, Another aspect of the present invention includes a high speed, light-field direction system for in-flight projectile interception, comprising: a laser source; an optical lens; and a flexure-based micro-array comprising: a plurality of micro-assemblies, each comprising: a micro-mirror; and means for electrostatically actuating the micro-mirror with at least three flexure bearings operatively connected to tip and/or tilt the micro-mirror while decoupling from other independently driven micro-mirror displacements, wherein the plurality of micro-assemblies are arranged with the micro-mirrors juxtaposed in a substantially 2D array, and the micro-array is arranged to deflect a laser beam from the laser source through the optical lens by independently pivoting the micro-mirrors to concentrate the laser beam emitted from the optical lens upon a target.

Another aspect of the present invention includes a high speed, light-field direction system for in-flight projectile interception, comprising: a laser source; an optical lens; and a flexure-based micro-array comprising: a plurality of micro-assemblies, each comprising: a micro-mirror; and at least three electrostatic actuation modules for tipping, and/or tilting the micro-mirror, each actuation module comprising: a base with first and second electrodes electrically isolated from each other; an electrically conductive lever arm; a first flexure bearing suspending the lever arm adjacent the first and second electrodes so that electrical activation of at least one of the first and second electrodes produces an electrostatic moment of force on the lever arm to resiliently bias the first flexure bearing and pivot the lever arm about a fulcrum; and a second flexure bearing connecting the lever arm to the micro-mirror at a connection location that is different from other connection locations of the other actuation modules so that pivoting the lever arm about the fulcrum induces the second flexure bearing to pivot the micro-mirror about a micro-mirror pivot axis defined between two of the other connection locations while the second flexure bearing decouples the lever arm from micro-mirror displacements induced by two of the other actuation modules connected to the two other connection locations defining the micro-mirror pivot axis, wherein the plurality of micro-assemblies are arranged with the micro-mirrors juxtaposed in a substantially 2D array, and the micro-array is arranged to deflect a laser beam from the laser source through the optical lens by independently pivoting the micro-mirrors to concentrate the laser beam emitted from the optical lens upon a target.

Another aspect of the present invention includes a high speed, light-field direction system for in-flight projectile interception, comprising: a laser source; an optical lens; and a flexure-based micro-array comprising: a plurality of micro-assemblies, each comprising: an actuator base having four electrode quadrants electrically isolated from each other; a micro-mirror having four electrically conductive quadrants; and at least three blade flexures substantially co-planar to each other, and peripherally extending from and alongside the micro-mirror to respective anchor ends fixed relative to the base for suspending the quadrants of the micro-mirror adjacent the electrode quadrants of the actuator base, so that electrical activation of an electrode quadrant in a diametrically opposing pair of electrode quadrants displaces an adjacent quadrant of the body towards the electrically activated electrode quadrant, for tipping, and/or tilting the micro-mirror, wherein the plurality of micro-assemblies are arranged with the micro-mirrors juxtaposed in a 2D array, and the micro-array is arranged to deflect a laser beam from the laser source through the optical lens by independently pivoting the micro-mirrors to concentrate the laser beam emitted from the optical lens upon a target.

Another aspect of the present invention includes a high speed, light-field direction system for in-flight projectile interception, comprising: a laser source; an optical lens; and a flexure-based micro-array comprising: a plurality of micro-assemblies, each comprising: a micro-mirror, a post cantilevered to the micro-mirror; at least three blade flexures substantially co-planar to each other, and peripherally extending from and alongside the micro-mirror to respective anchor ends; and four electrostatic actuation modules arranged in four quadrants for tipping, and/or tilting the micro-mirror, each actuation module comprising: a base with an electrode electrically isolated from electrodes of other bases, and wherein the anchor ends of the blade flexures are fixed relative to the base; an electrically conductive shuttle; a first flexure bearing suspending the shuttle adjacent the electrode so that electrical activation of the electrode resiliently biases the first flexure bearing and displaces the shuttle in an opposite direction to shuttle displacement in a diametrically opposite quadrant and in an orthogonal direction to shuttle displacements in adjacent quadrants; and a second flexure bearing connecting the shuttle to the post so that displacing the shuttle induces the second flexure bearing to pull the post to pivot the micro-mirror about a rotation axis orthogonal to the pulled direction, while the second flexure bearing decouples the shuttle from micro-mirror displacements induced by the other actuation modules in adjacent quadrants, wherein the plurality of micro-assemblies are arranged with the micro-mirrors juxtaposed in a substantially 2D array, and the micro-array is arranged to deflect a laser beam from the laser source through the optical lens by independently pivoting the micro-mirrors to concentrate the laser beam emitted from the optical lens upon a target.

Another aspect of the present invention includes an optical tweezer-based fabrication system comprising: a laser system adapted to produce a plurality of laser beams; a fabrication stage adjacent an operating volume; a material source for introducing material particles into the operating volume; and at least two flexure-based micro-arrays, each comprising: a plurality of micro-assemblies, each comprising: a micro-mirror; and means for electrostatically actuating the micro-mirror with at least three flexure bearings operatively connected to tip and/or tilt the micro-mirror while decoupling from other independently driven micro-mirror displacements, wherein the plurality of micro-assemblies are arranged with the micro-mirrors juxtaposed in a substantially 2D array, and wherein the micro-arrays are arranged so that the micro-mirrors of one micro-array are independently controlled to direct laser beams to intersect other laser beams directed by the micro-mirrors of another micro-array, so as to steer and/or process, in parallel, material particles trapped by the intersecting laser beams.

Additionally other aspects of the present invention include, in addition to the flexure-based micro-array described above, any of the following: 1. further comprising a controller adapted to control in parallel the micro-mirrors of the micro-arrays, 2. wherein the laser system includes a laser source, 3. wherein the laser system includes at least two laser sources, with one of the laser sources adapted to produce laser beams having a wavelength not absorbed by the material particles to provide increased momentum transfer to the material particle, and with another one of the laser sources adapted to produced laser beams having a wavelength absorbed by the material materials to provide increased energy to the material particle, 4. further comprising an optical probe laser adapted to produce a laser beam having a wavelength that is reflected by the material particles, and 5. further comprising an optical lens positioned between the micro-arrays and the operating volume for focusing the laser beams in the operating volume.

BRIEF DESCRIPTION OF THE DRAWINGS

The accompanying drawings, which are incorporated into and form a part of the disclosure, are as follows.

DETAILED DESCRIPTION

Figure 1:
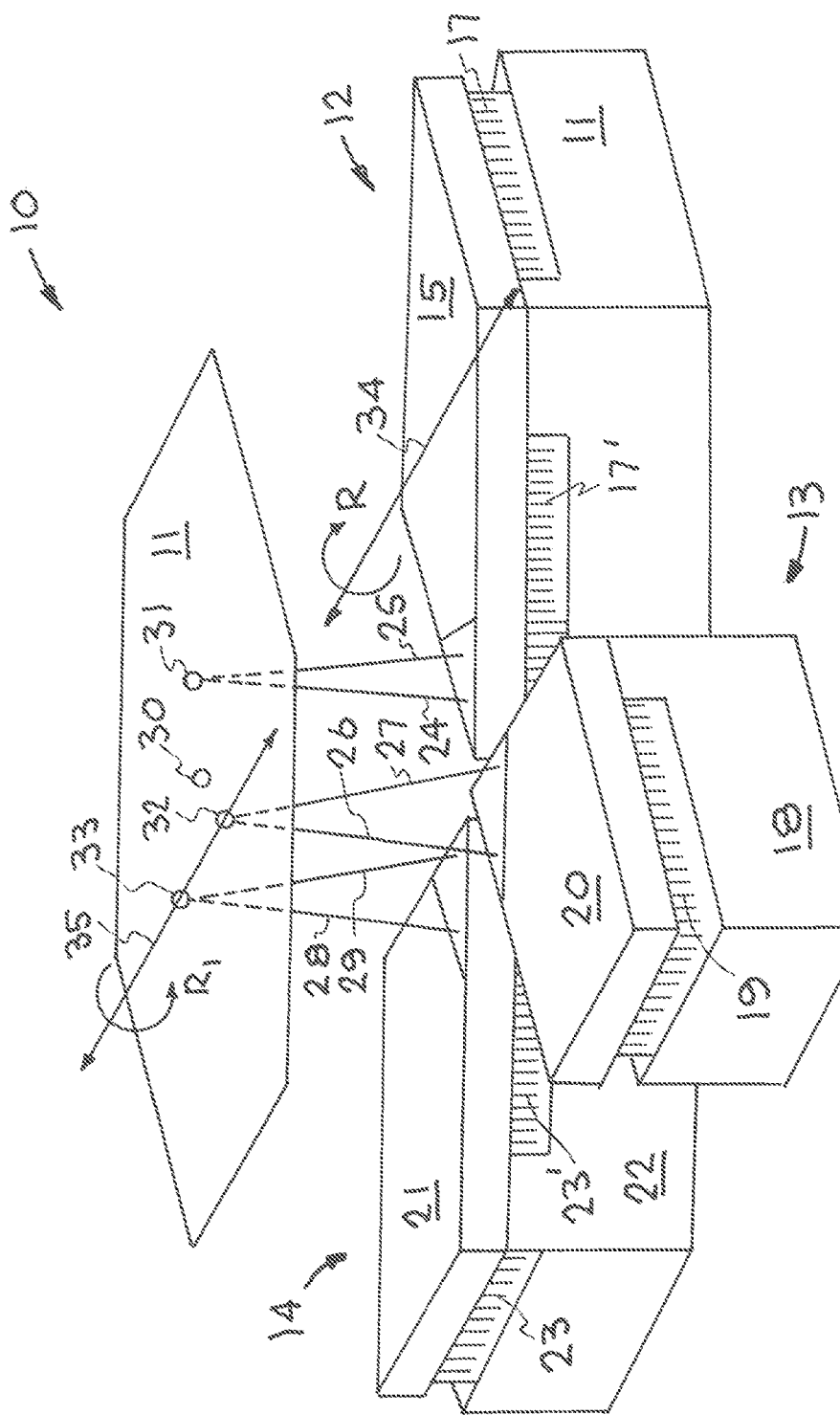
FIG. 1 is a top perspective view of an example embodiment of the flexure-based micro-actuation device of the present invention, having three actuation modules with substantially rhombus-shaped lever arms and a hexagonal object (e.g. mirror) that is tip, tilt, and/or piston actuated by the lever arms.
Figure 2:
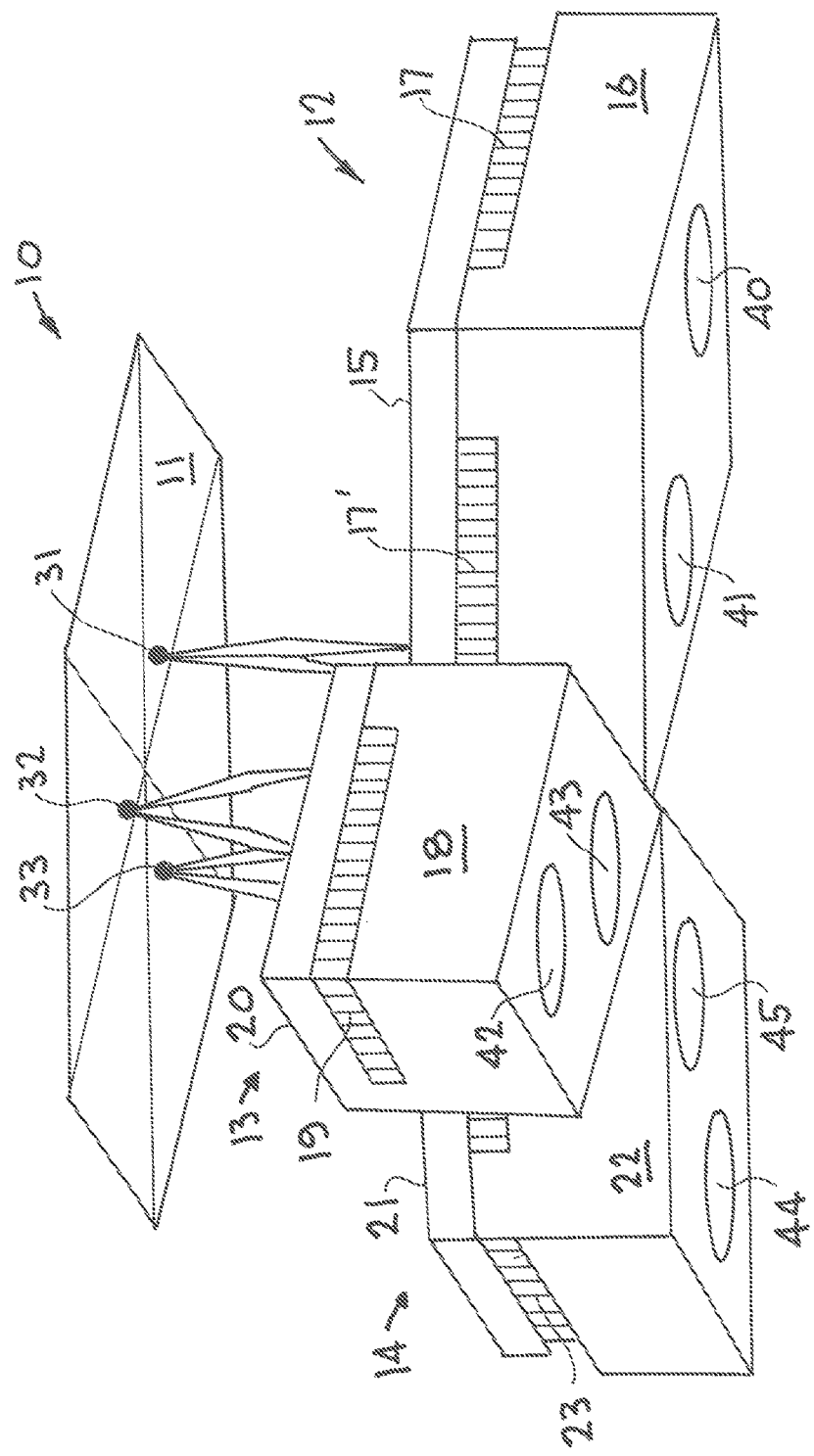
FIG. 2 is a bottom perspective view of the flexure-based micro-actuation device of FIG. 1.
Figure 3:
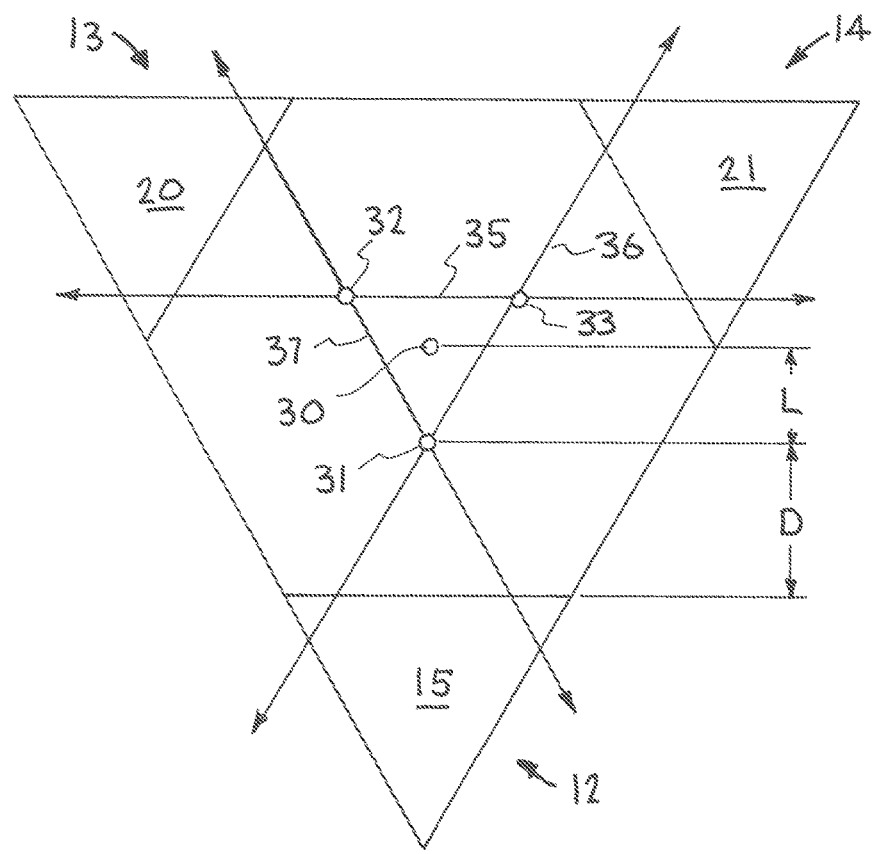
FIG. 3 is a top plan view of the flexure-based micro-actuation device of FIG. 1.
Figure 4:
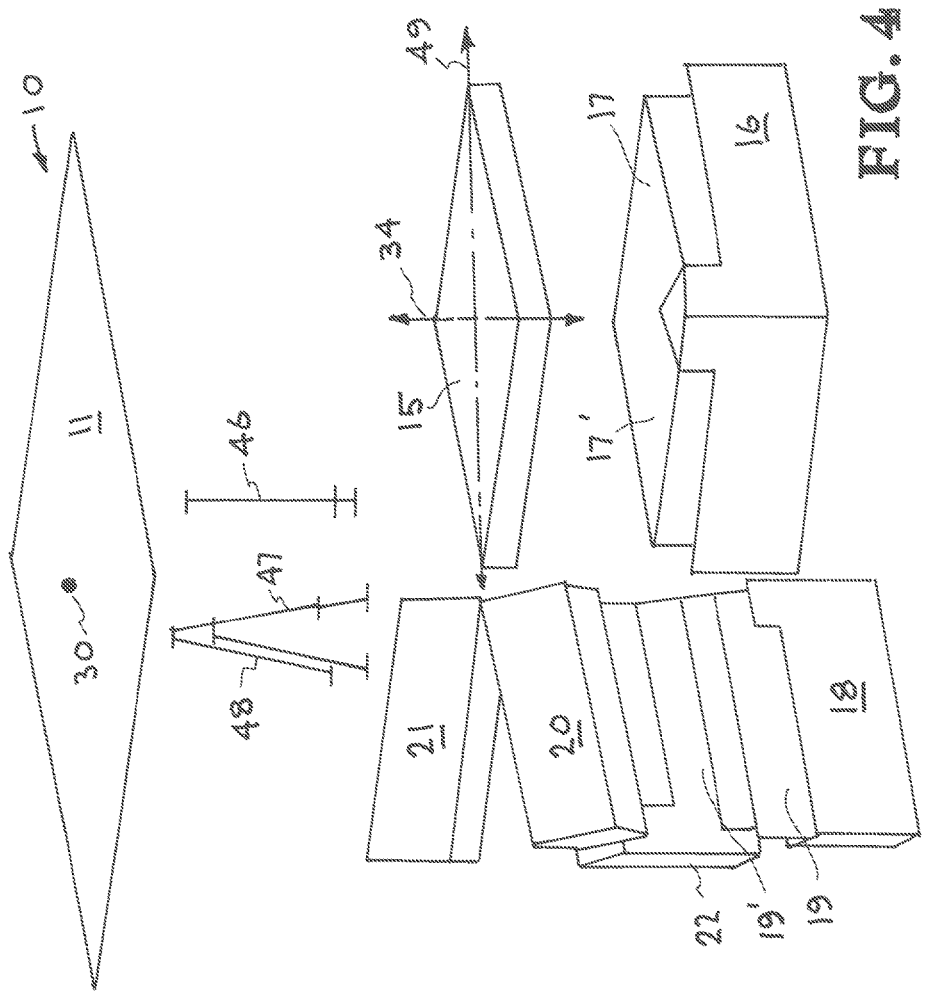
FIG. 4 is an exploded perspective view of the flexure-based micro-actuation device of FIG. 1.
Figure 5:
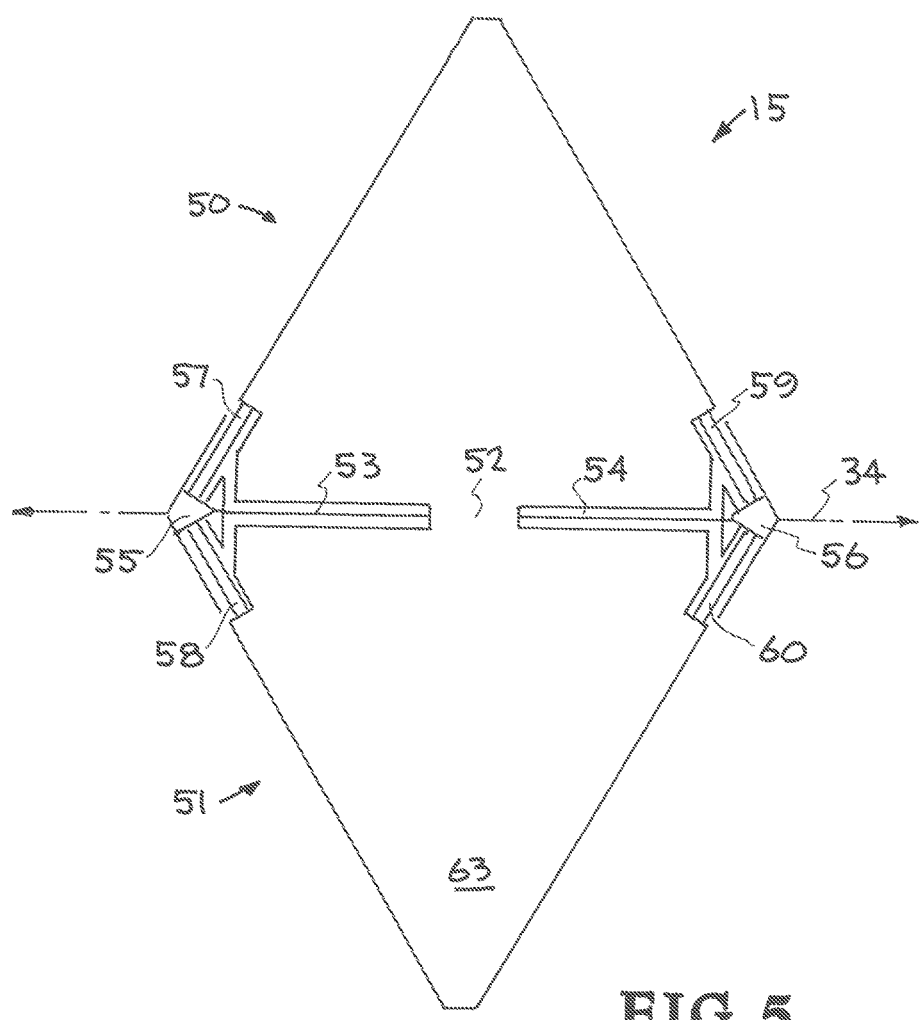
FIG. 5 is a top plan view of the lever arm (or actuation paddle) of the flexure-based micro-actuation device of FIG. 1.
Figure 6:
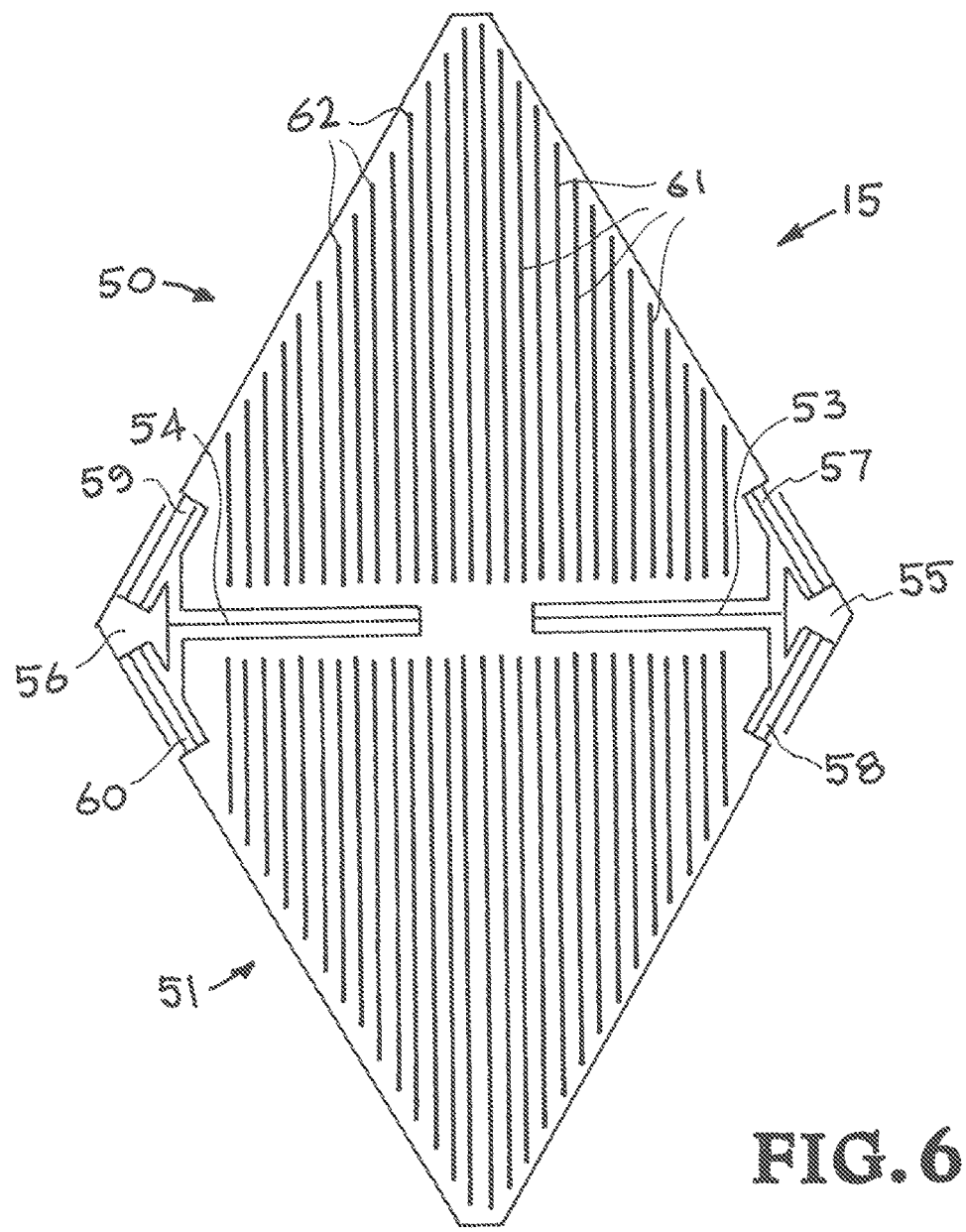
FIG. 6 is a bottom plan view of the lever arm (or actuation paddle) of FIG. 5.
Figure 7:
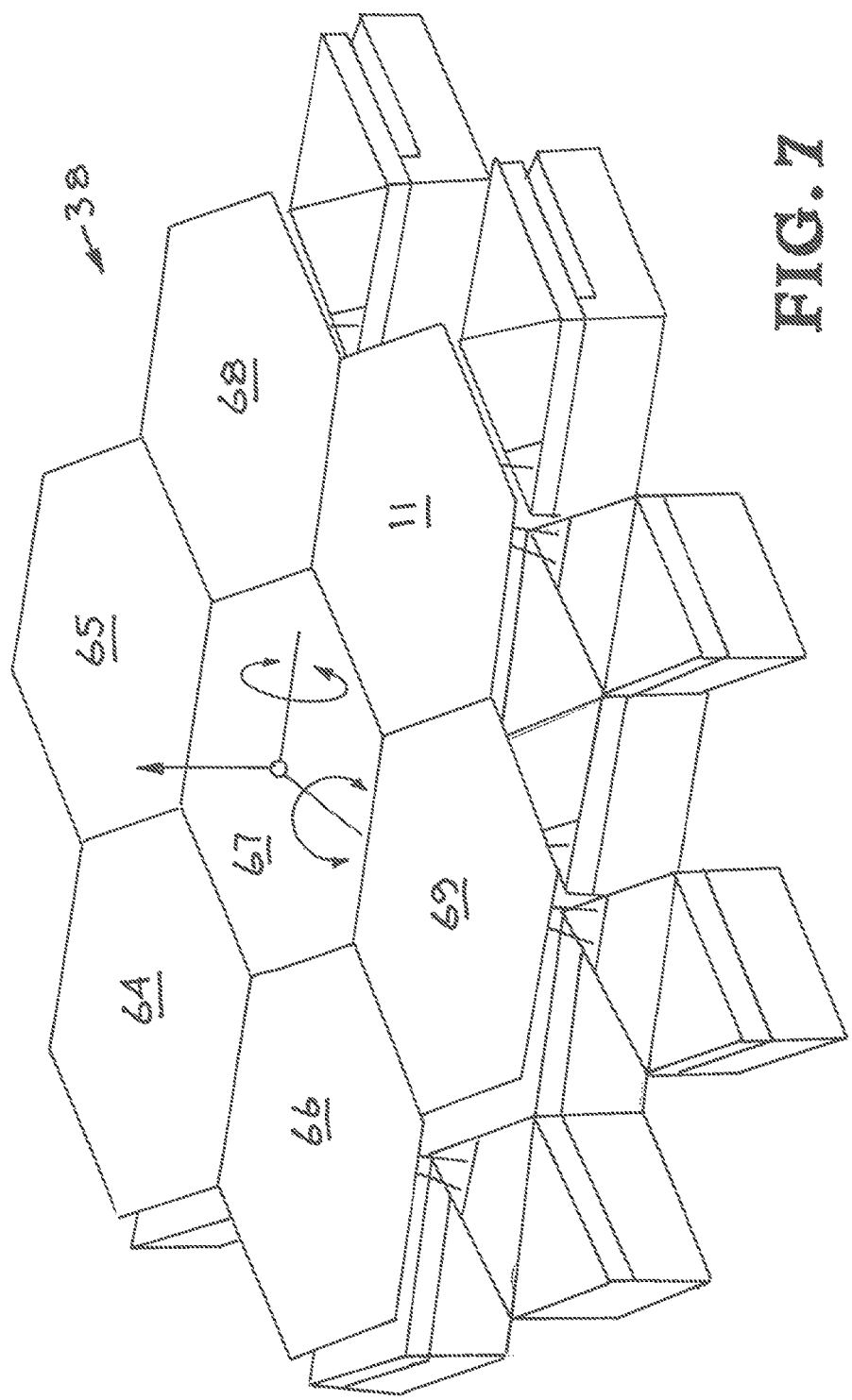
FIG. 7 is a perspective view of an example embodiment of the flexure-based micro-array of the present invention that is assembled from a plurality of the flexure-based micro-actuation devices of FIG. 1.
Figure 8:
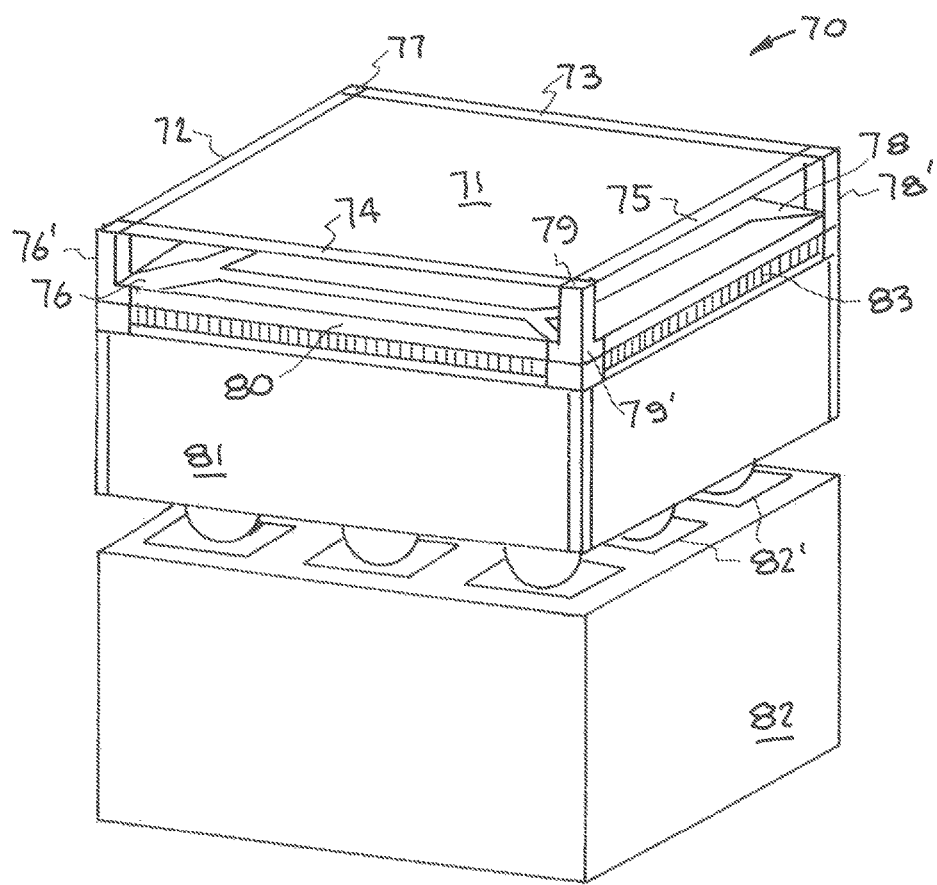
FIG. 8 is a perspective view of a second example embodiment of the flexure-based micro-actuation device of the present invention, having four actuation modules with substantially trapezoid-shaped lever arms and a square object (e.g. mirror) that is tip, tilt, and/or piston actuated by the lever arms.
Figure 9:
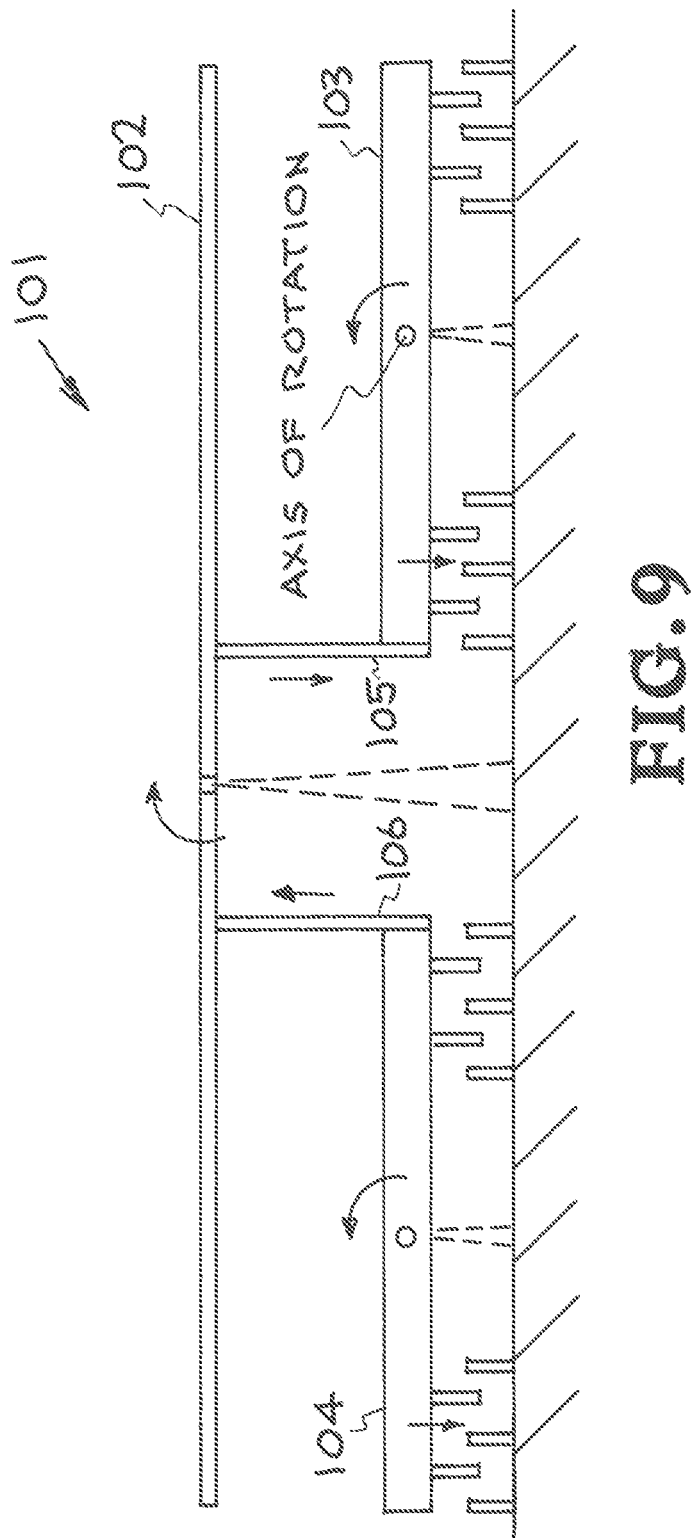
FIG. 9 is a schematic illustration of the rotary comb-drive actuation of the flexure-based micro-actuation device of FIG. 8.
Figure 10:
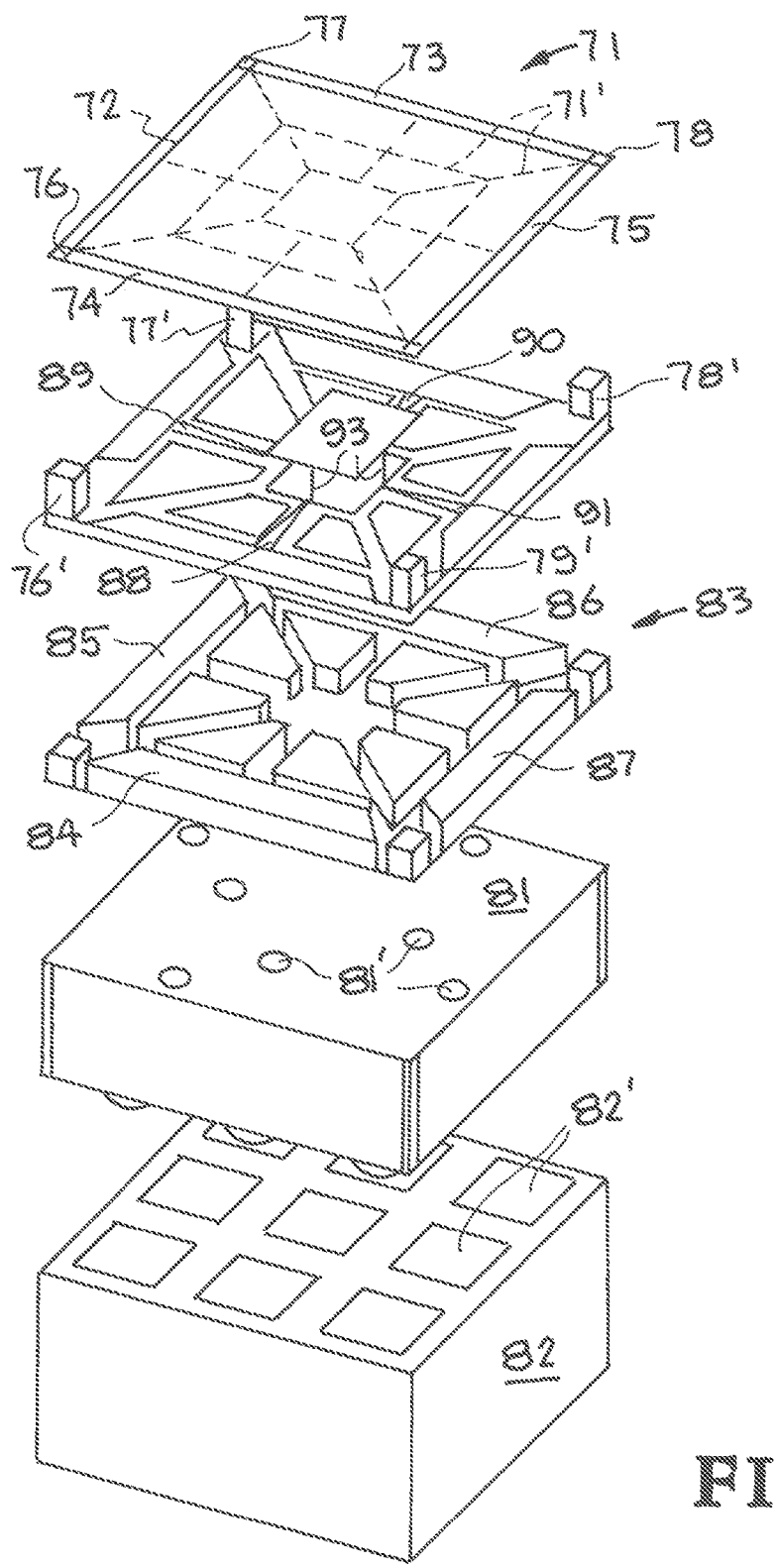
FIG. 10 is an exploded perspective view of the flexure-based micro-actuation device of FIG. 9.
Figure 11:
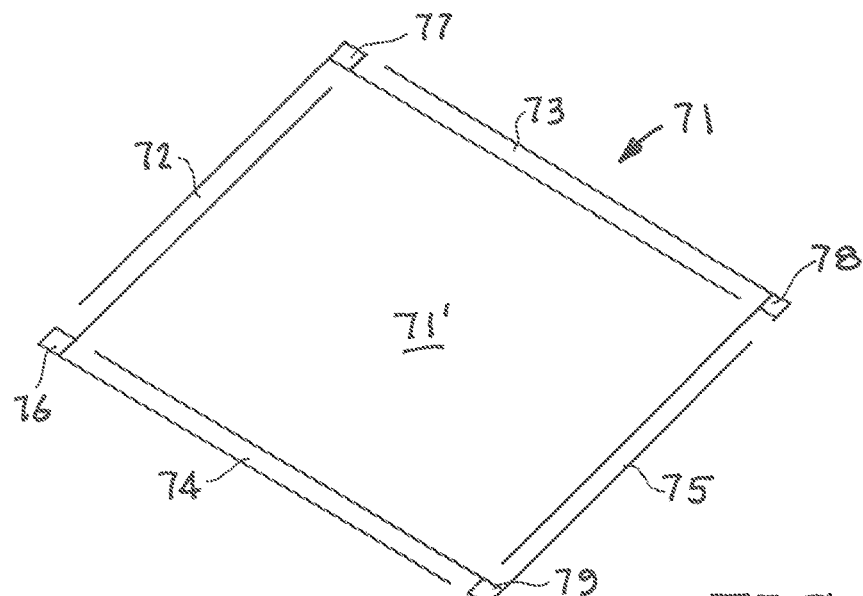
FIG. 11 is a perspective view of the actuated object shown in FIG. 10, having four blade flexures arranged substantially co-planar to each other and peripherally extending alongside the four sides of the micro-mirror to respective anchor ends.
Figure 12:
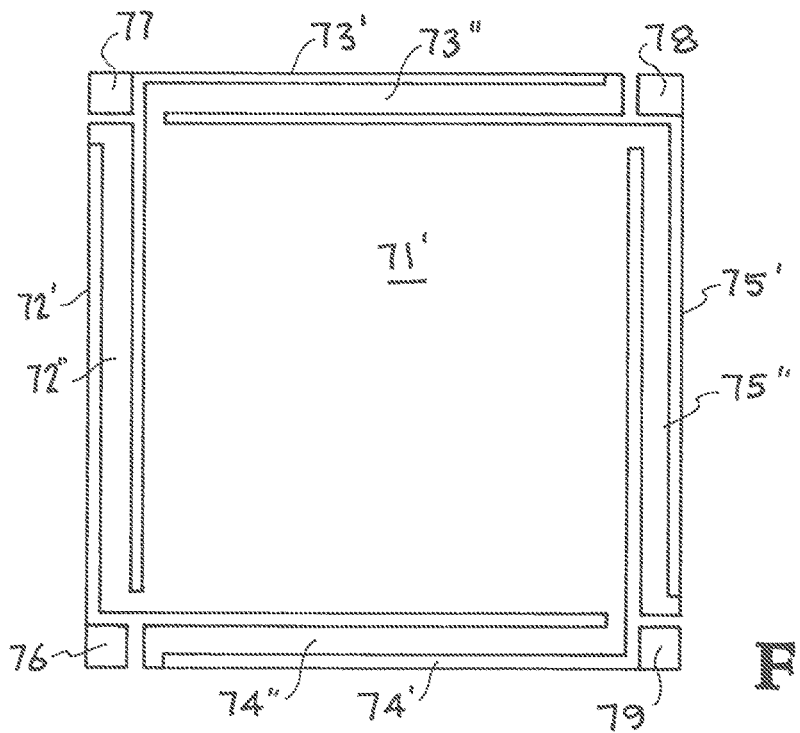
FIG. 12 is a plan view of the actuated object of FIG. 11.
Figure 13:
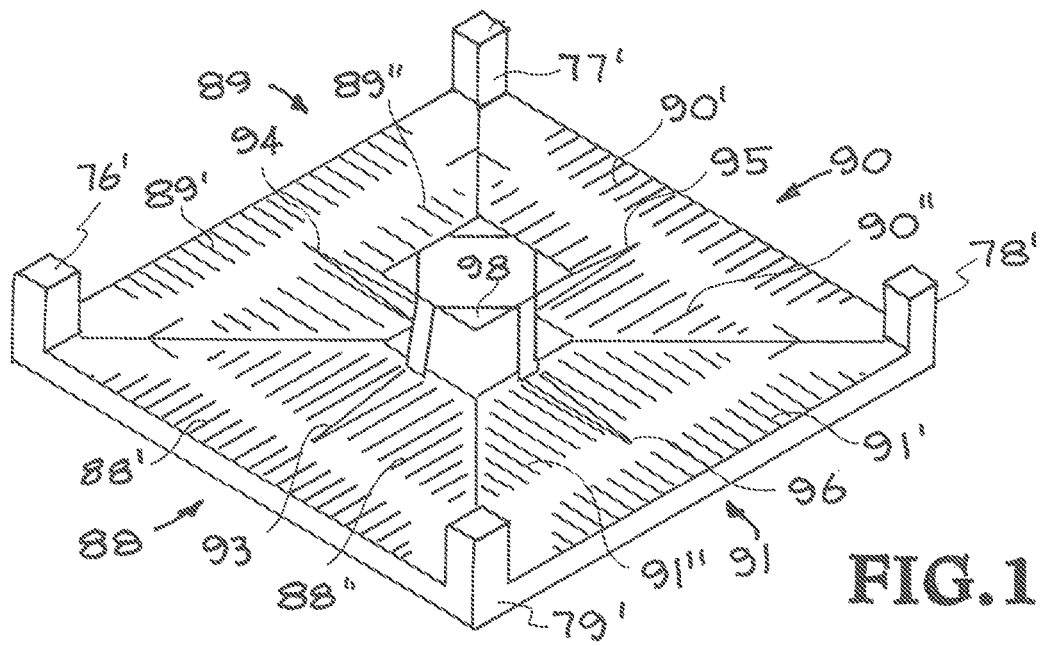
FIG. 13 is a perspective view of the four substantially trapezoid-shaped flexure-suspended lever arms shown in FIG. 10.
Figure 14:
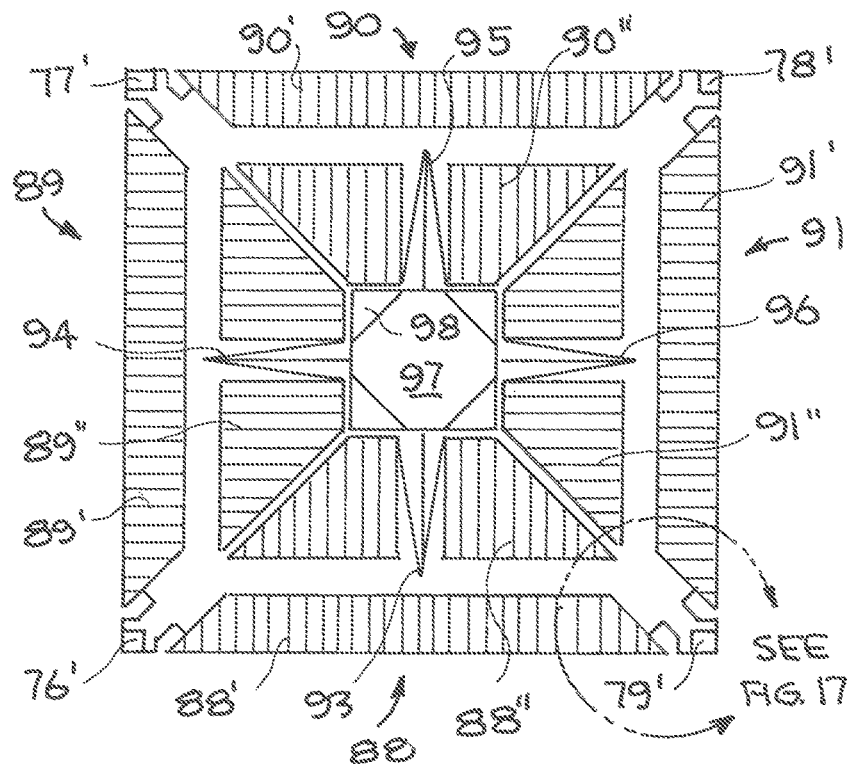
FIG. 14 is a plan view of the four substantially trapezoid-shaped flexure-suspended lever arms of FIG. 13 forming a square outline.
Figure 15:
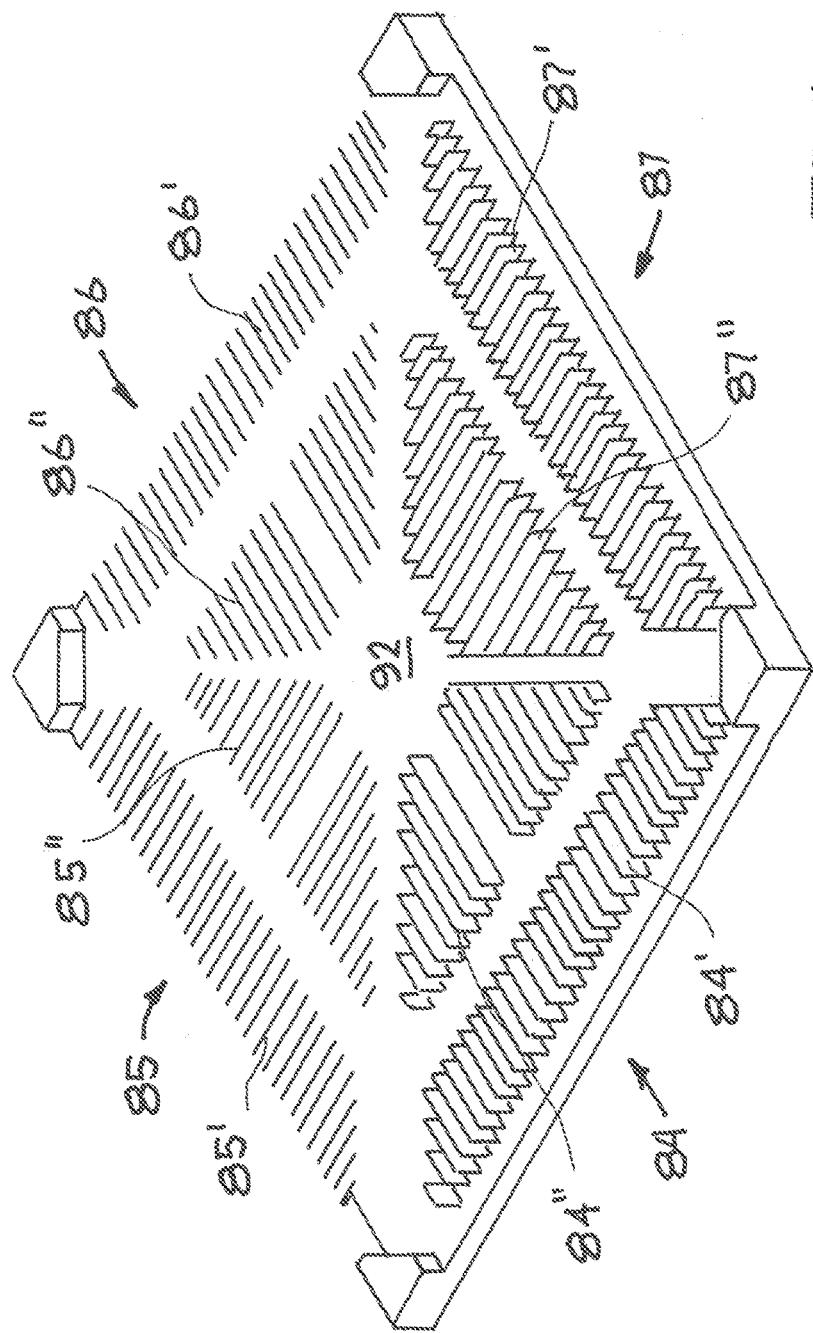
FIG. 15 is a perspective view of the four bases with electrodes of FIG. 11.
Figure 16:
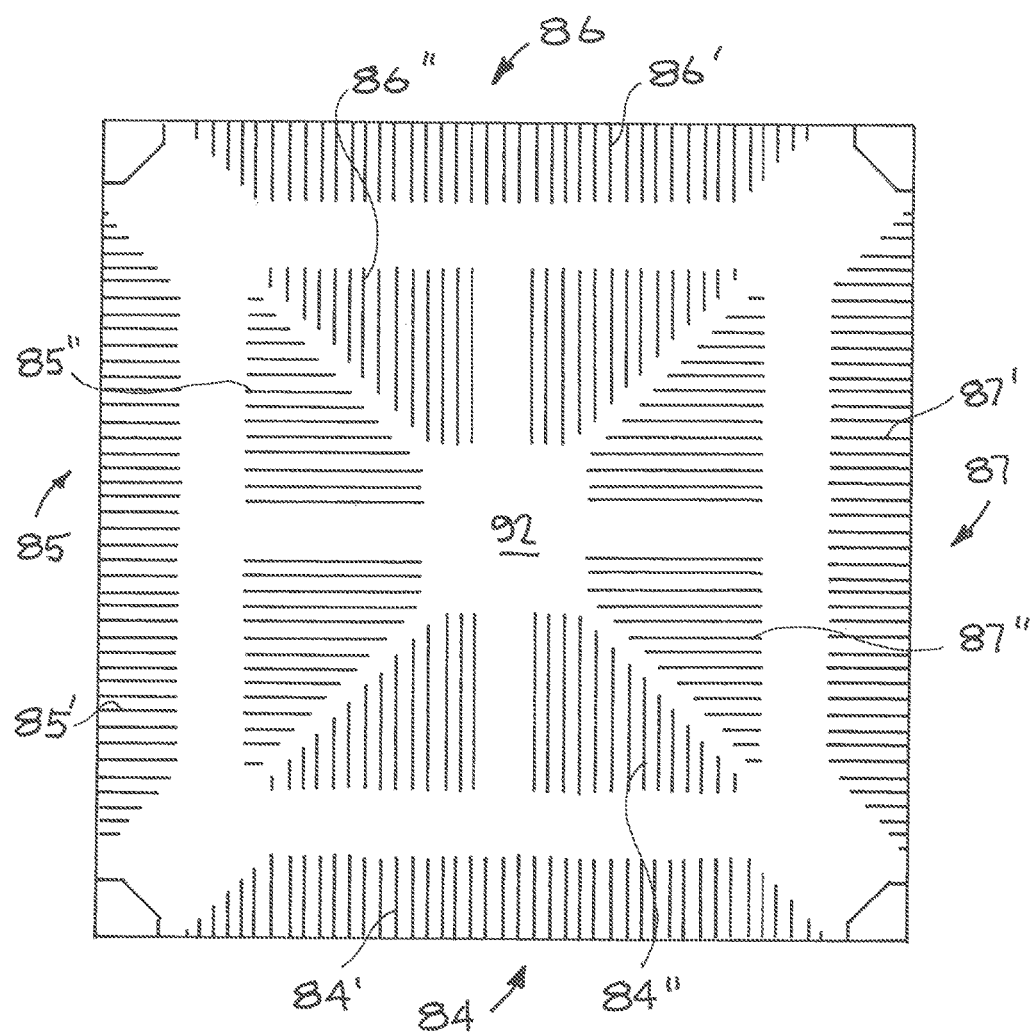
FIG. 16 is a plan view of the four bases with electrodes of FIG. 15.
Figure 17:
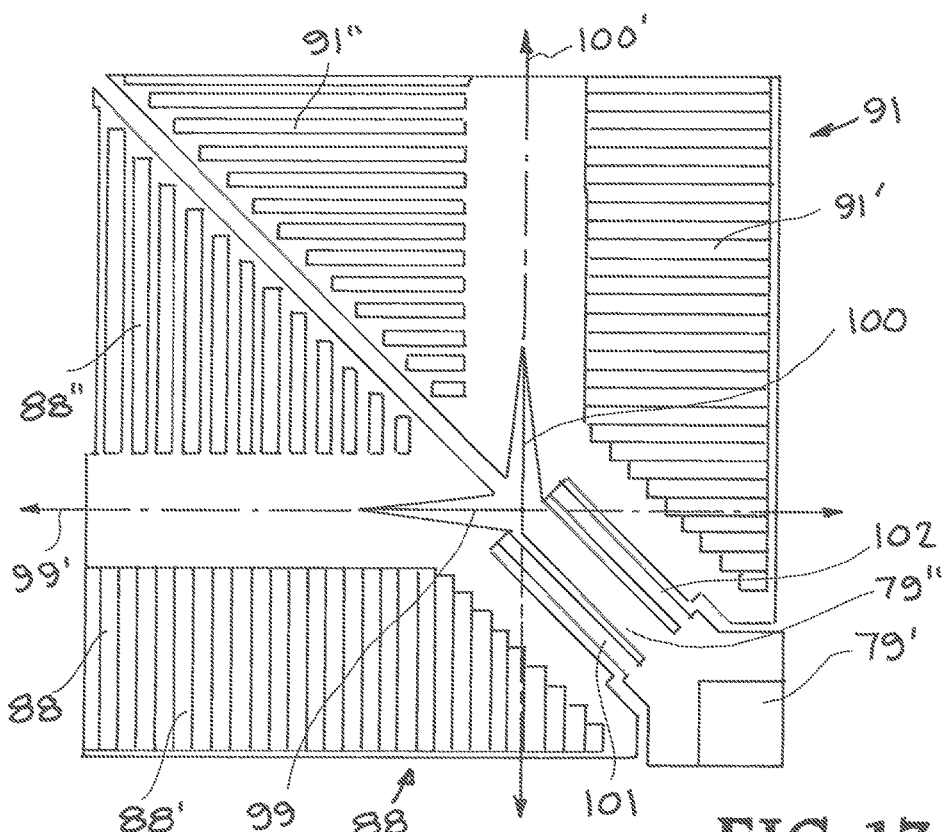
FIG. 17 is an enlarged view of a corner shown in FIG. 14 showing an example embodiment of the first flexure bearing.
Figure 18:
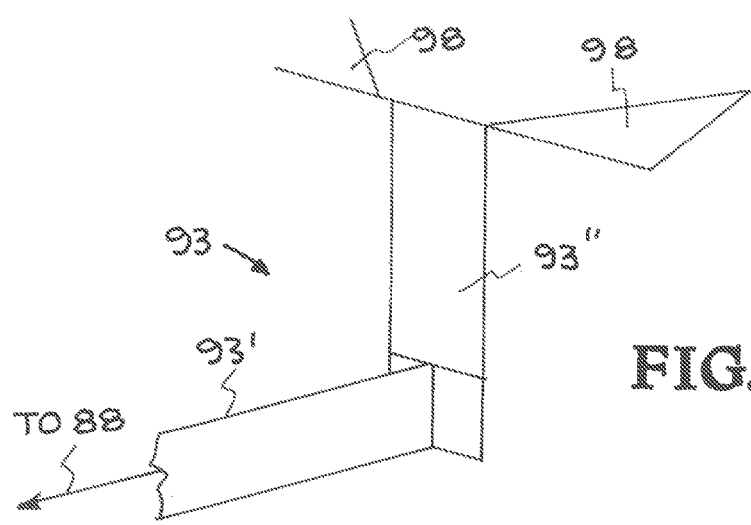
FIG. 18 is an enlarged view of the angled arm flexure shown in FIG. 13.
Figure 19:
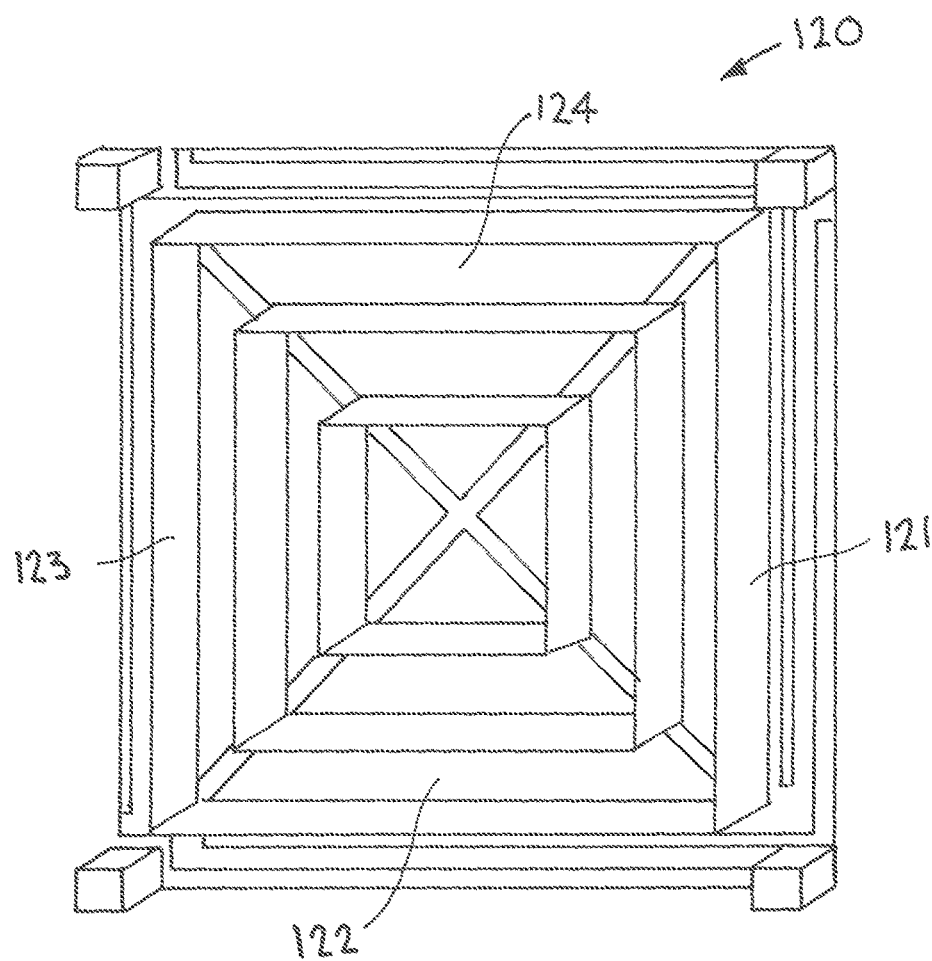
FIG. 19 is a bottom perspective view of an actuated object (e.g. mirror) used in a third example embodiment of the flexure-based micro-actuation device of the present invention which operates by vertical comb drive.
Figure 20:
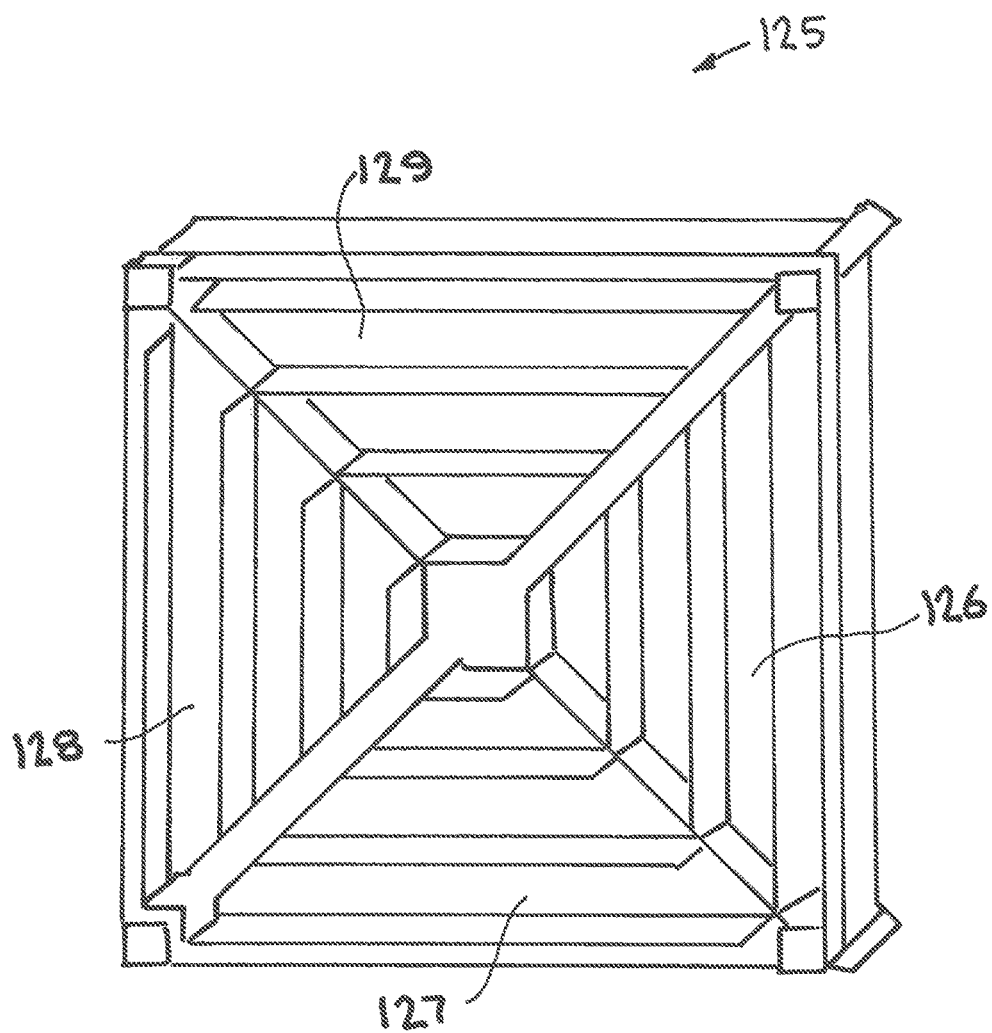
FIG. 20 is a bottom perspective view of a base with electrodes used in the third example embodiment of the flexure-based micro-actuation device of the present invention.
Figure 21:
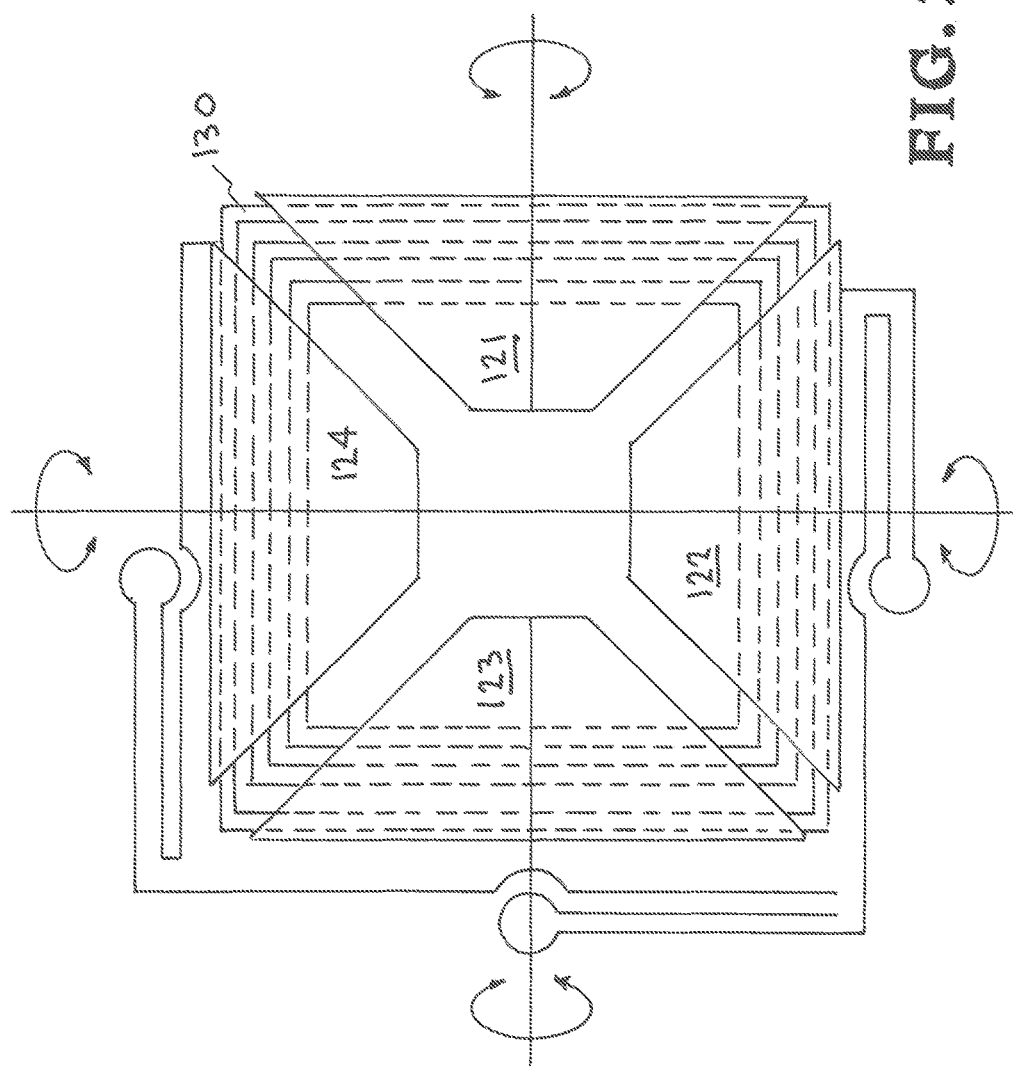
FIG. 21 is a schematic illustration of the actuated object of FIG. 19 showing four sets of comb fingers arranged in four symmetric trapezoid-shaped regions.
Figure 22:
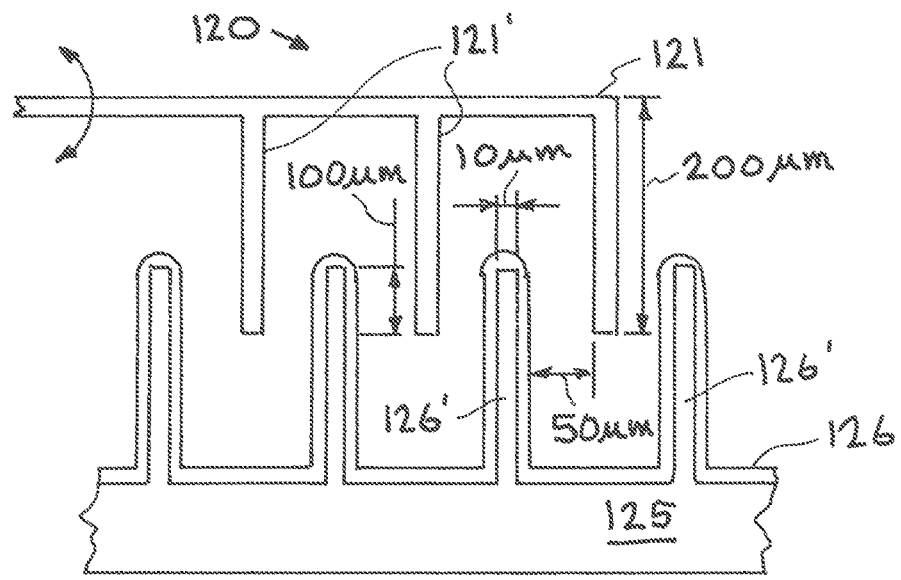
FIG. 22 is a partial schematic view of the vertical comb drive engagement of the comb fingers of the actuated object of FIG. 19 and the comb fingers of the base of FIG. 20, prior to electrical activation.
Figure 23:
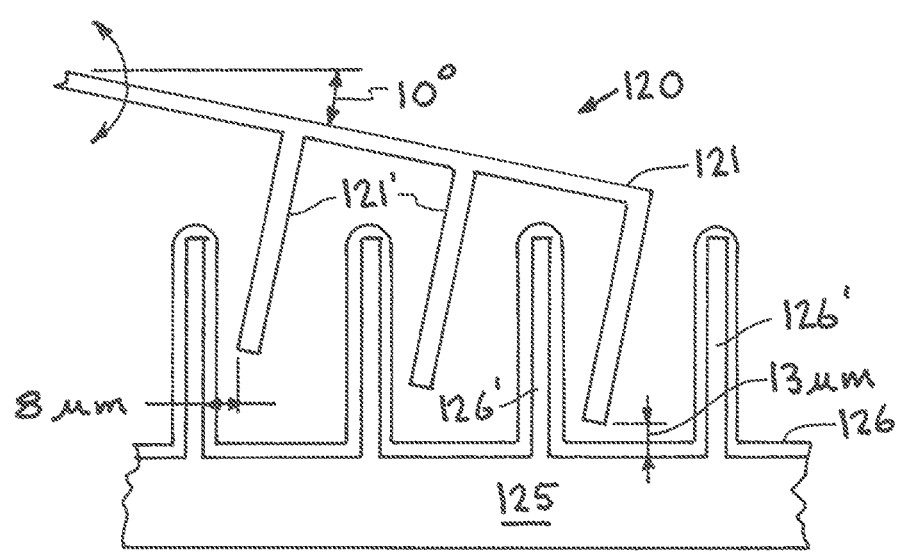
FIG. 23 is a partial schematic view of the vertical comb drive engagement following FIG. 22, and illustrating electrical activation.
Figure 24:
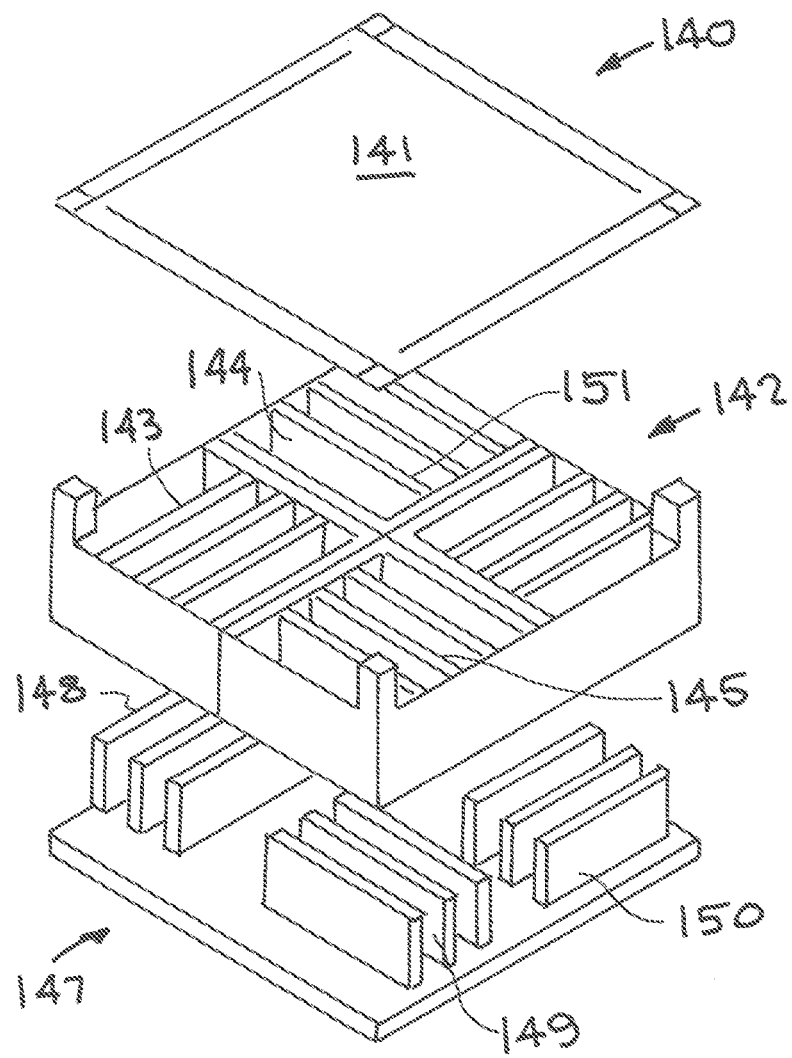
FIG. 24 is an exploded perspective view of a fourth example embodiment of the flexure-based micro-actuation device of the present invention.
Figure 25:
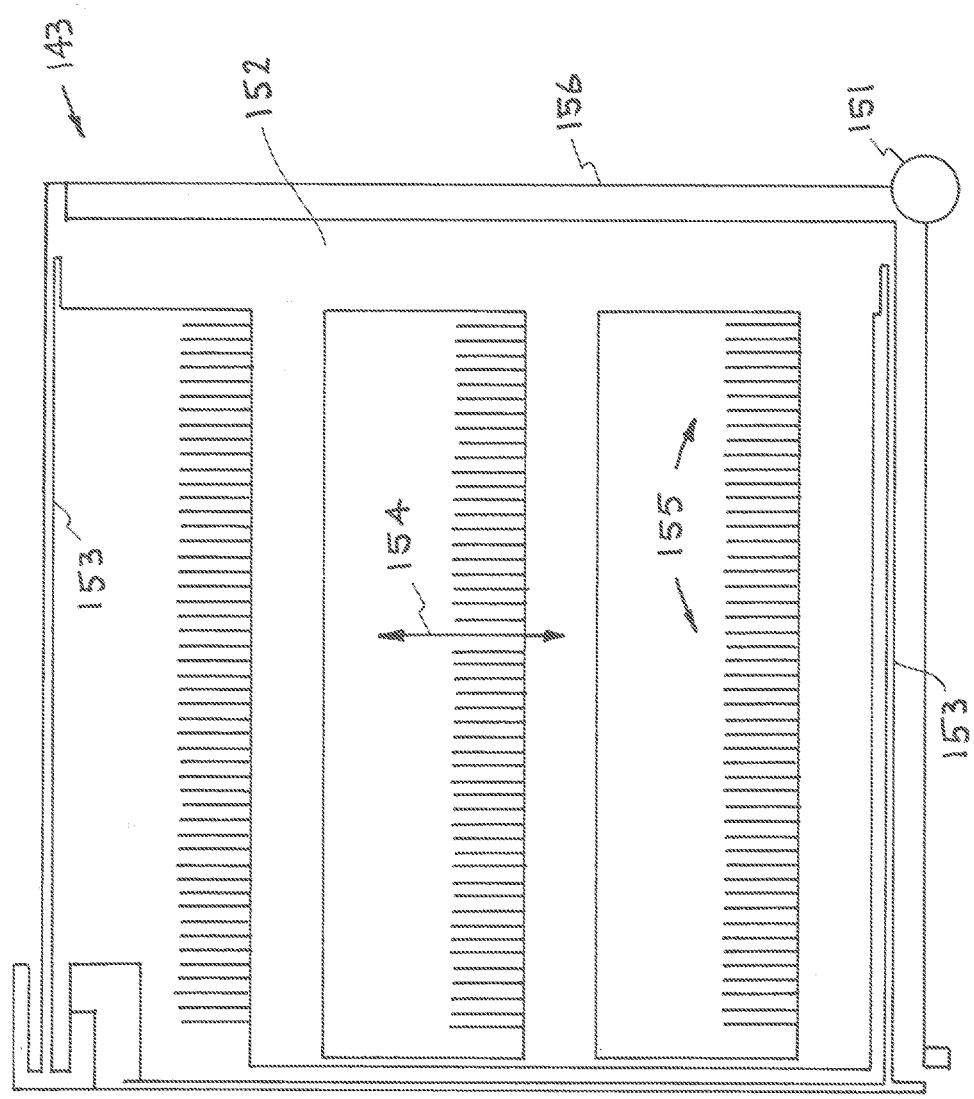
FIG. 25 is a plan view of one of the actuator shuttles of FIG. 24.
Figure 26:
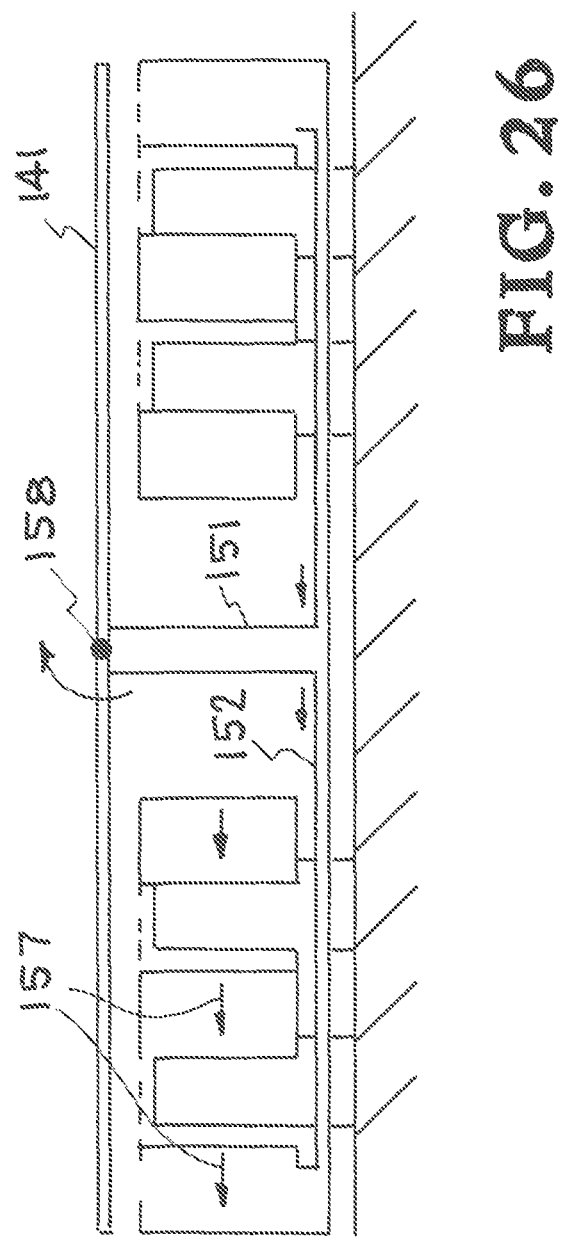
FIG. 26 is a schematic illustration of the linear comb-drive actuation of the flexure-based micro-actuation device of FIG. 24.
Figure 27:
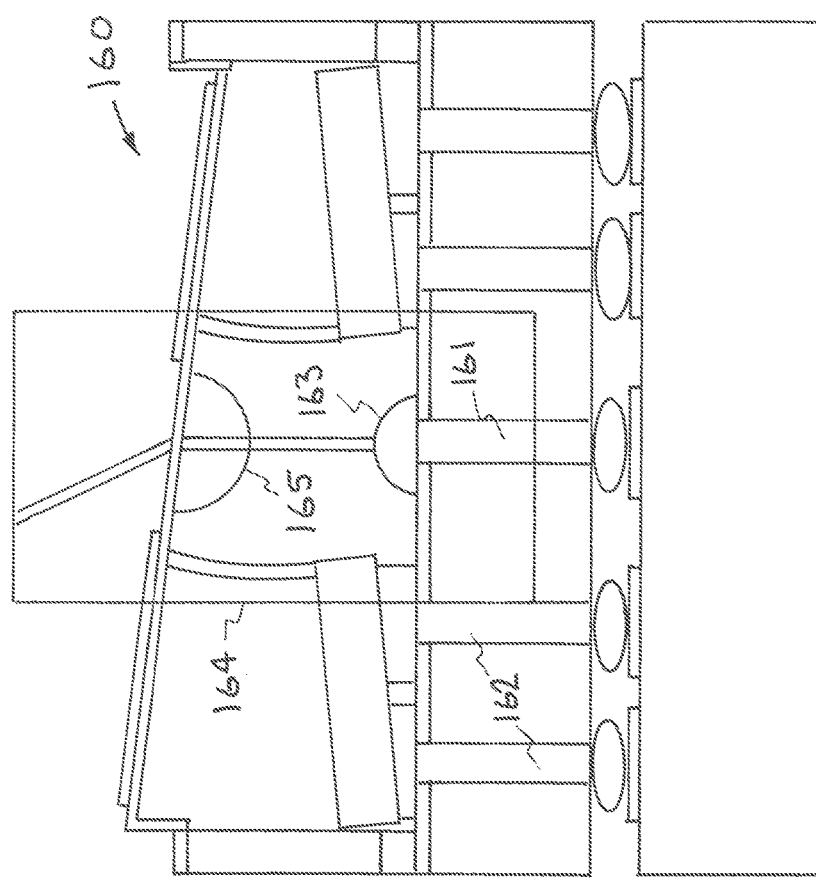
FIG. 27 is a schematic illustration of another example embodiment of the flexure-based micro-actuation device and micro-array of the present invention having a central optic channel for directing a beam of light (e.g. laser) out through a transmissive optical element carried by the actuated object.
Figure 28:
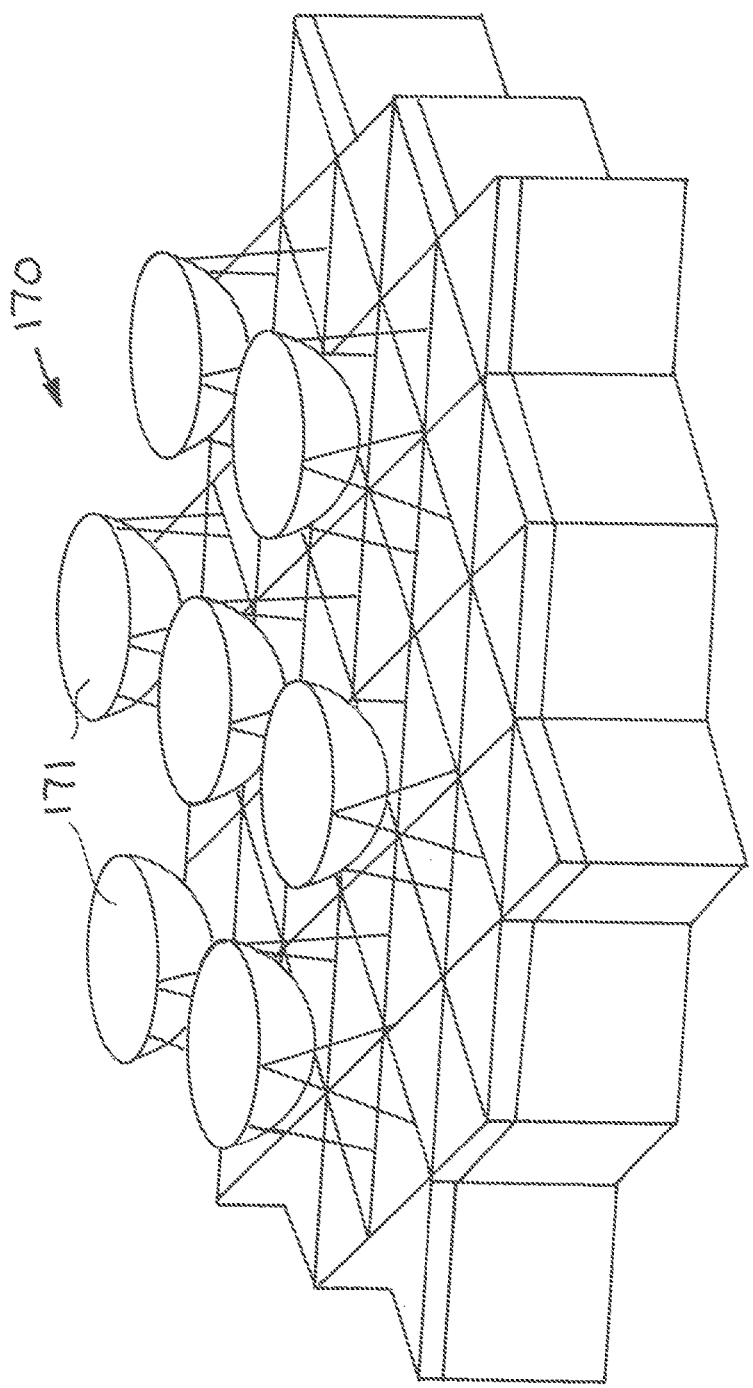
FIG. 28 is a perspective view of an example flexure-based micro-array of the present invention having transmissive optic lens each mounted by three pairs of wire flexures to corresponding actuation modules.fs
Figure 29:
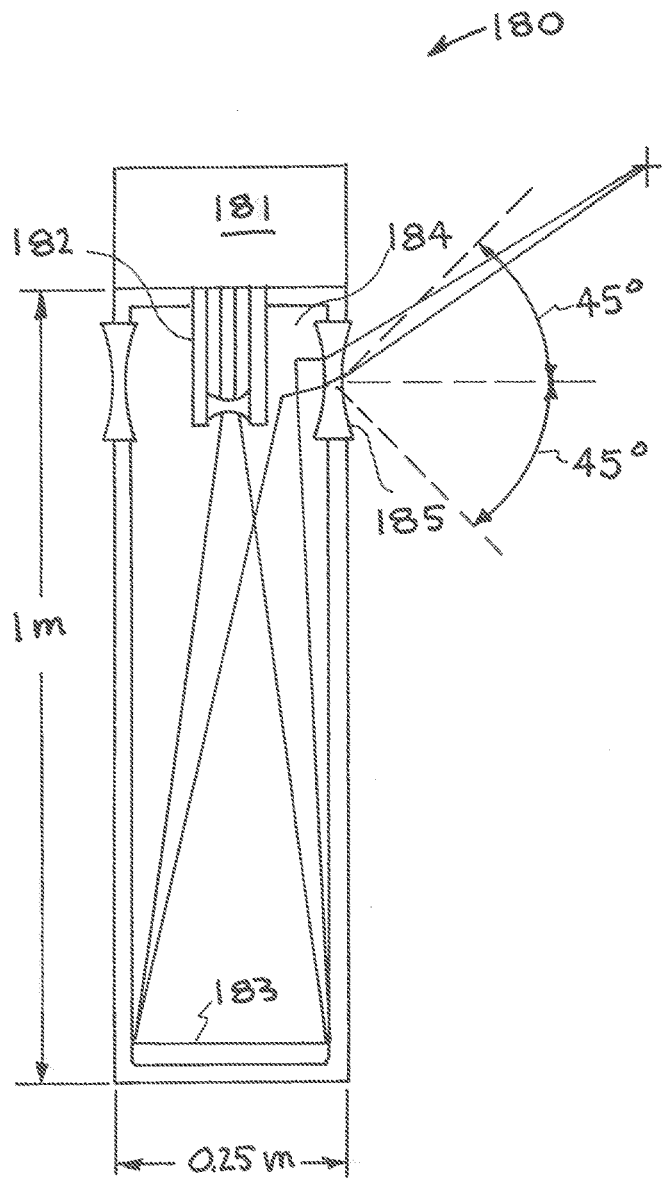
FIG. 29 is a schematic illustration of an example embodiment of a laser system of the present invention using a flexure-based mirror-array for redirecting incoming projectiles.
Figure 30:
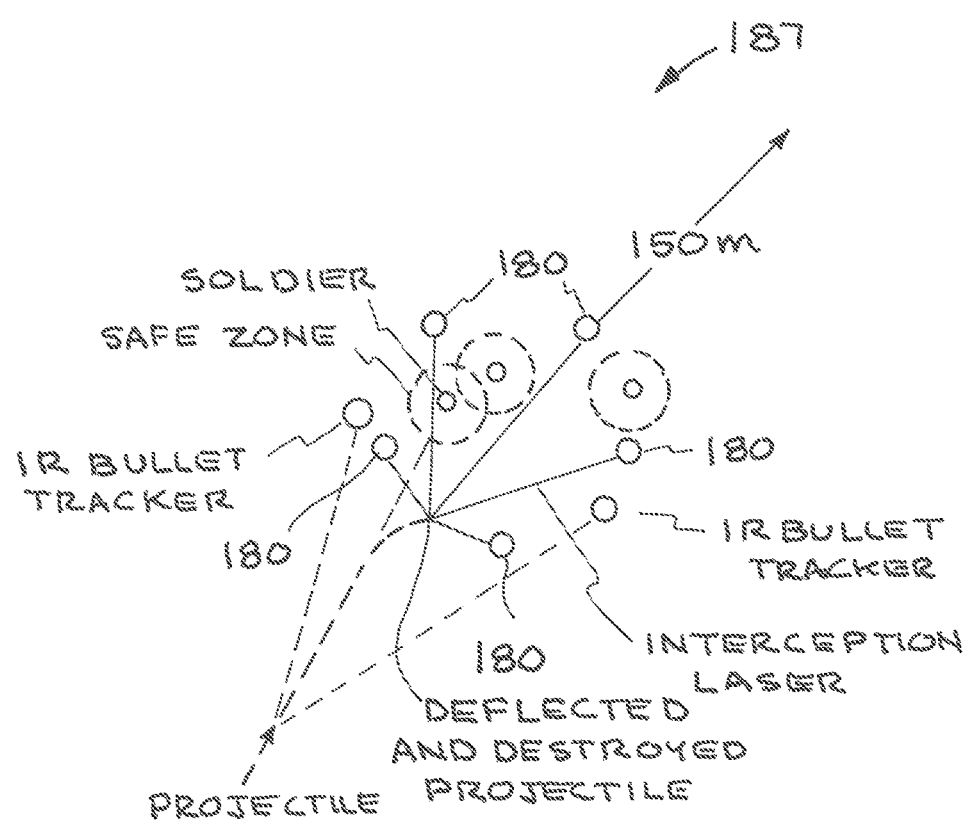
FIG. 30 is a schematic deployment of the laser system of the present invention in conjunction with bullet tracking systems.
Figure 31:
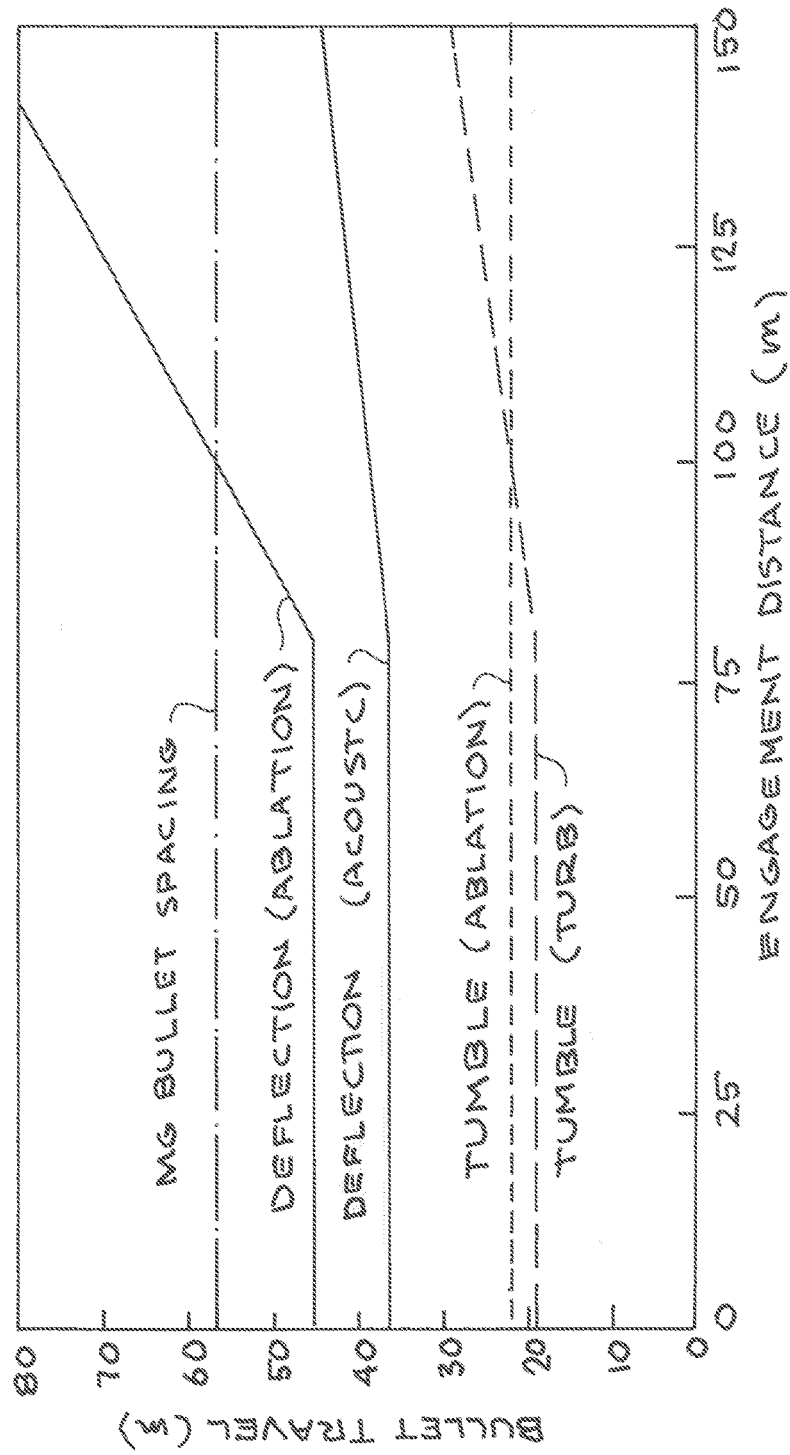
FIG. 31 is a graph charting the effects of the laser system of the present invention in tangential engagement of a bullet projectile.
Figure 32:
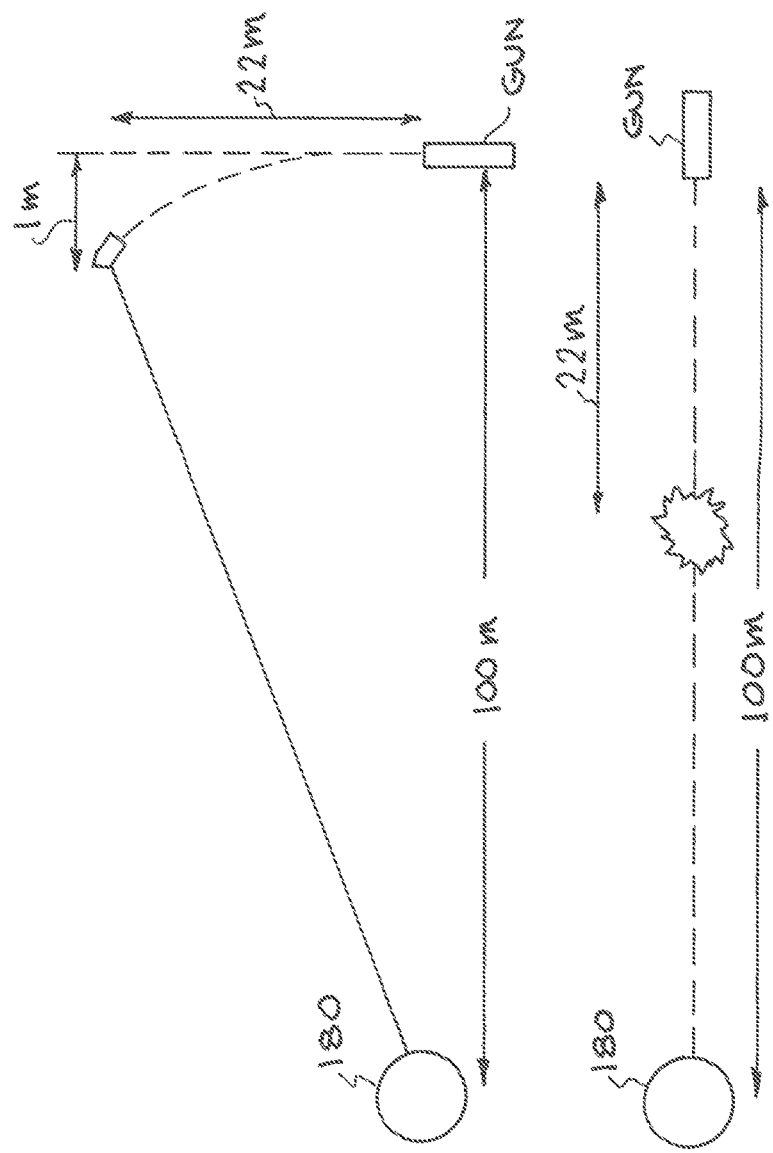
FIG. 32 is a plan view of an example embodiment of a light field direction syatem 180 as used in relation to a projectile shot from a gun.
Figure 33:
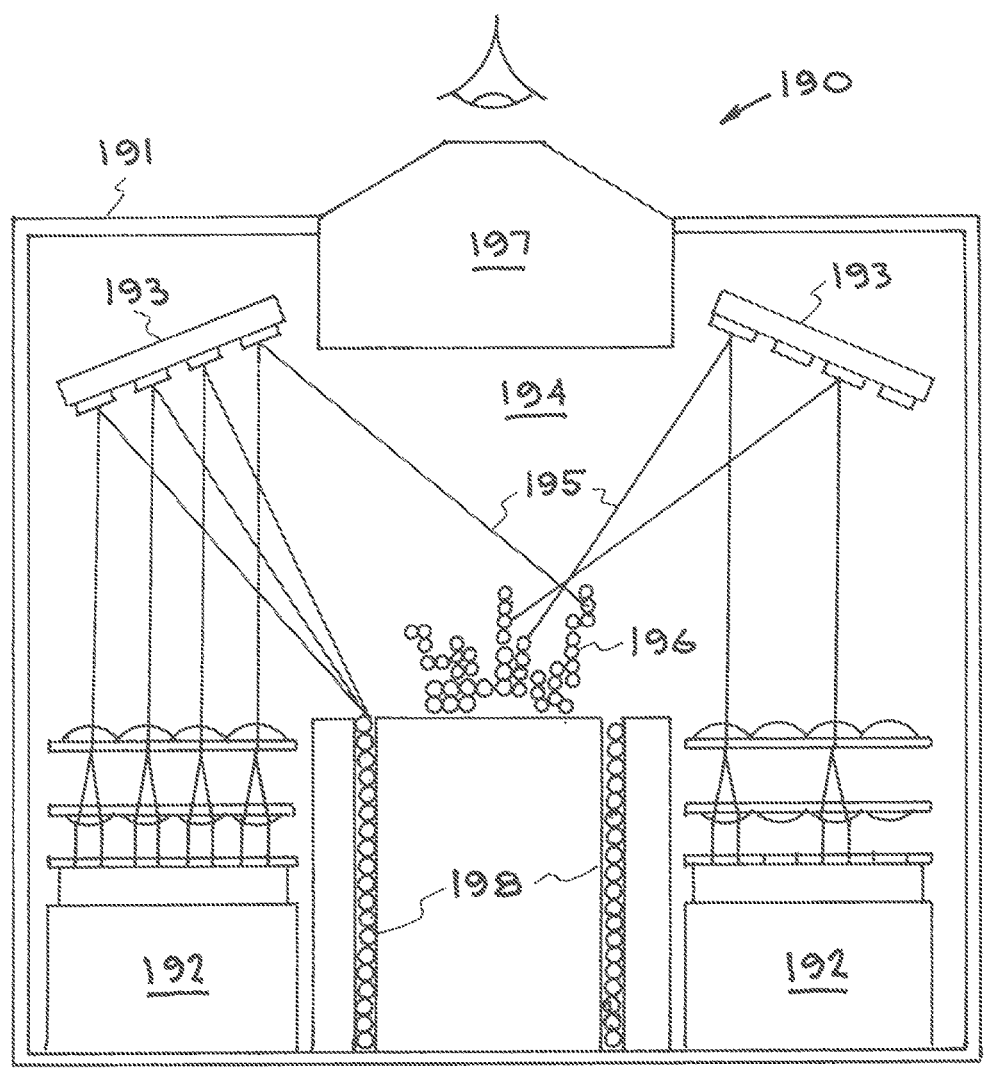
FIG. 33 is a schematic illustration of an example embodiment of a laser-based fabrication system using a flexure-based mirror-array of the present invention.
Figure 34:
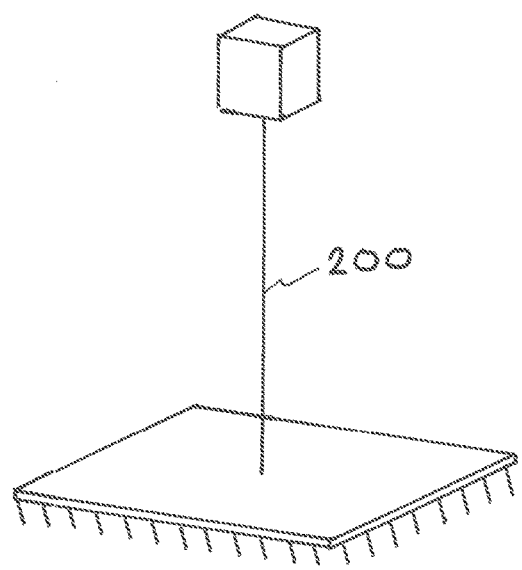
FIG. 34 is an example wire flexure used in the various embodiments of the flexure-based micro-actuation device and micro-array of the present invention.
Figure 35:
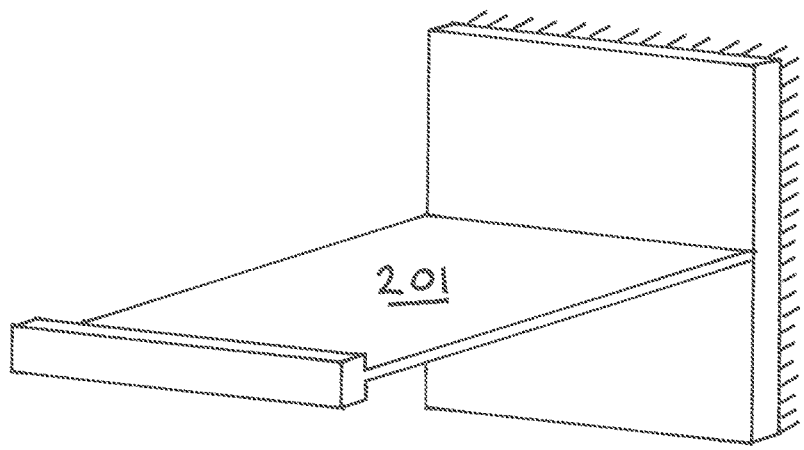
FIG. 35 is an example blade flexure used in the various embodiments of the flexure-based micro-actuation device and micro-array of the present invention.

The present invention is generally directed to a high-speed, high-performance, flexure-based tip-tilt-piston micro-array having a plurality of micro-assemblies/devices (e.g. micro-mirrors) which are capable of rapidly (5-40 kHz) and massively in parallel, directing light over large angles (>10*) in two axes-tip and tilt, as well as about 30 μm in the piston (out of plane) axis with continuous closed-loop motion control. The array may be made in various sizes (e.g. >10,000 mirrors such as in a 100×100 array) where each mirror may be on the scale of about 1 millimeter wide. The present invention may use non-silicon structural materials like metal or polymers to meet speed and robustness requirements. Example scale of the system which was found to have few enough mirrors to allow individual control, but small enough for sufficient bandwidth, is about 0.3-1 mm. It is appreciated that the present invention may enable advances in science and high performance optical technologies, such as for example advances in ultra-rapid laser scanning, high speed imaging, material handling, advanced nanofabrication, high-powered laser steering for intercepting or destroying fast moving objects (e.g. bullets, space debris, or LIFE targets), cloaking devices, and true 3D information displays that don't require glasses. Applications for the proposed micro-mirror array include, for example, in-flight bullet defeat; fusion target tracking for high rate energy production; true-3D image generation for multi-threaded autostereoscopic displays and cloaking devices; high-speed confocal microscopy; high-speed gas detection sensors; ultra-rapid, multi-material 3D printing; photonic computing and advances The following is a legend for the reference characters shown in the figures.

- 10—example embodiment of single unit micro-actuation device used in micro-array, and having rotary actuator (lever arm) driven configuration.
- 11—hexagonal object (e.g. hexagonal mirror)
- 12—actuation module #1, shown having a generally rhombic prism shape.
- 13—actuation module #2, shown having a generally rhombic prism shape.
- 14—actuation module #3, shown having a generally rhombic prism shape.
- 15—lever arm of actuation module #1, shown having a rhombus shape.
- 16—base of actuation module #1
- 17—radially outer electrode actuation module #1
- 17'—radially inner electrode actuation module #1
- 18—base of actuation module #2
- 19—radially outer electrode of actuation module #2
- 19'—radially inner electrode of actuation module #2
- 20—lever arm of actuation module #2, shown having a rhombus shape.
- 21—lever arm of actuation module #3, shown having a rhombus shape.
- 22—base of actuation module #3
- 23—radially outer electrode of actuation module #3
- 23'—radially inner electrode of actuation module #3
- 24—wire flexure (paired with wire flexure 25 to form triangular truss-shaped second flexure bearing (e.g. one of hexapod flexures) of actuation module #1
- 25—wire flexure (paired with wire flexure 24 to form triangular truss-shaped second flexure bearing (e.g. one of hexapod flexures) of actuation module #1
- 26—wire flexure (paired with wire flexure 27 to form triangular truss-shaped second flexure bearing (e.g. one of hexapod flexures) of actuation module #2
- 27—wire flexure (paired with wire flexure 26 to form triangular truss-shaped second flexure bearing (e.g. one of hexapod flexures) of actuation module #2
- 28—wire flexure (paired with wire flexure 29 to form triangular truss-shaped second flexure bearing (e.g. one of hexapod flexures) of actuation module #3
- 29—wire flexure (paired with wire flexure 28 to form triangular truss-shaped second flexure bearing (e.g. one of hexapod flexures) of actuation module #3
- 30 center of hexagonal object (e.g. mirror)
- 31 connection location (e.g. point) of the apex of wire flexures 24 and 25
- 32 connection location (e.g. point) of the apex of wire flexures 26 and 27
- 33 connection location (e.g. point) of the apex of wire flexures 28 and 29
- 34 is the fulcrum, i.e. pivot axis, of the lever arm 15, which rotates as represented by $R_{paddle}$. It is also shown as the minor axis of the rhombus shaped lever arm 15.
- 35 is one of the object pivot axes (e.g. mirror pivot axes) of the object 11, which rotates as represented by $R_1$, defined by and between connection locations 32 and 33 of the object.
- 36 is another one of the object pivot axes (e.g. mirror pivot axes) of the object 11, which rotates as represented by $R_3$, defined by and between two connection locations 31 and 33 of the object.
- 37 is another one of the object pivot axes (e.g. mirror pivot axes) of the object 11, which rotates as represented by $R_5$, defined by and between two connection locations 31 and 32 of the object.
- 40 and 41 are two vias connecting to respective electrodes 17 and 17' of actuation module #1.
- 42 and 43 are two vias connecting to respective electrodes 19 and 19' of actuation module #2.
- 44 and 45 are two vias connecting to respective electrodes 23 and 23' of actuation module #3.
- 46 is the second flexure bearing comprising the two wire flexures connected to lever arm 15, having a wide base at the lever arm, and an apex at the connection location.
- 47 is the second flexure bearing comprising the two wire flexures connected to lever arm 20, having a wide base at the lever arm, and an apex at the connection location.
- 48 is the second flexure bearing comprising the two wire flexures connected to lever arm 21, having a wide base at the lever arm, and an apex at the connection location.
- 49 is the major axis of the rhombus shaped lever arm 15.
- 50 is one of the two sections of the rhombus shaped lever arm 15 divided by the fulcrum.
- 51 is the other one of the two sections of the rhombus shaped lever arm 15 divided by the fulcrum.
- 52 is the yoke of the lever arm to which the blade flexures 53 and 54 are connected.
- 53 and 54 are blade flexures connecting the lever arm 15 (at the yoke 52) to anchors 55 and 56.
- 55 and 56 are anchors which are fixed relative to the base.
- 57 and 58 are stabilizing flexures, shown as blade flexures, connecting the anchor 55 to off-axis locations from the fulcrum.
- 59 and 60 are stabilizing flexures, shown as blade flexures, connecting the anchor 56 to off-axis locations from the fulcrum.
- 61 are comb fingers (electrically conductive) oriented orthogonal to the fulcrum.

62 are the capped finger ends connecting the comb fingers.

63 is the capped top connecting the comb fingers at a top side of the lever arm on an opposite side of the base.

38 is an example embodiment of the micro-array, having hexagonal objects 64-69 juxtaposed to 11 and each other, to form a substantially gapless surface.

64-69 are hexagonal objects (e.g. mirrors) similar to hexagonal mirror 11.

70 is a second example embodiment of a single unit micro-actuation device used in the micro-array, and having rotary actuator (lever arm) driven configuration.

71 is object, shown having square shape with four sides.

71' is the top surface (e.g. reflective surface) of the object.

72-75 are four side blade flexures suspending the object.

76-79 are four corner anchor ends of the blade flexures fixed relative to the base 83.

79' is one of four anchor posts fixed relative to the base.

79" is the extension arm of the anchor post 79'

80 is an electrically ground plate, comprising four lever arms suspended over the base 83 by first flexure bearings.

81 is a via plate through which vias 81' extend to connect with electrodes in the base.

82 is a printed circuit board (PCB) having solder pads 82', upon which the micro-actuation device and the via plate is connected.

83 is the actuator base having four base sections 84-87.

84-87 are four trapezoid-shaped base sections (electrode quadrants) of the actuator base, arranged so that the longer bases of the trapezoid shapes together form the outline of a square.

84'-87' are the outer electrodes of the respective base sections 84-87.

84"-87" are the inner electrodes of the respective base sections 84-87.

88-91 are four trapezoid-shaped lever arms, also forming four quadrants, and arranged similar to the base sections so that the longer bases of the trapezoid shapes together form the outline of a square.

88'-91' are the radially outer sections of the respective lever arms 88-91 divided by the respective fulcrums.

88"-91" are the radially inner sections of the respective lever arms 88-91 divided by the respective fulcrums.

92 is the central space located between the inner electrodes 84"-87".

93-96 are the angled arm flexures of the second flexure bearings of the respective lever arms 88-91.

97 is the central space located between the radially inner sections of the lever arms 88-91.

98 is the connecter ring flexure flexibly connecting the top ends of the angled arm flexures to the object.

99 is one (of two) blade flexures of the first flexure bearing suspending the lever arm 88 to the anchor post 79'

99' is fulcrum/pivot axis of lever arm 88 along which the blade flexure 99 is aligned.

100 is one (of two) blade flexures of the first flexure bearing suspending the lever arm 91 to the anchor post 79'

100' is fulcrum/pivot axis of lever arm 91 along which the blade flexure 100 is aligned.

101 is a schematic embodiment of the second example embodiment of the rotary actuator (lever arm) driven micro-actuation device.

102 is the object, shown having a reflecting mirror surface.

103 is a first lever arm at a diametrically opposite position from second lever arm 104.

105 is the second flexure bearing (e.g. strut bearing) connecting the first lever arm to the object.

106 is the second flexure bearing (e.g. strut bearing) connecting the second lever arm to the object, showing how equally pushing the second flexure bearing 106 up while pulling the second flexure bearing 105 down, rotates the object about a center rotation axis.

120 is a bottom view of an object of a third example embodiment.

121-124 are four electrically conductive quadrants of the object.

125 is a top view of an actuator base 126-129 are four electrode quadrants of the actuator base.

121' are comb fingers of quadrant 121

126' are comb fingers of electrode quadrant 126.

130 are the traces connecting the quadrants 121-124 of the object.

140 fourth example embodiment of micro-array.

141 object, similar to object 71 with side blade flexures.

142 shuttle plate with four flexure-mounted shuttles 143-146

143-146 four actuation shuttles.

147 actuator base having four base sections.

148-150 three of four base sections.

151 post cantilevered to bottom of object.

152 shuttle body 153 first flexure bearings, shown as a pair of blade flexures 154 direction of shuttle movement.

155 comb fingers on shuttle body.

156 second flexure bearing shown as blade flexure connected to post 151 for pulling the post in diametrically opposite direction to that of shuttle in diametrically opposite quadrant.

157 shuttle actuation direction for pulling post 151, so as to rotate object 141 about rotation axis 158.

158 rotation axis of object.

160 embodiment with laser directed out from within micro-actuation device.

161 optical conduit passing light through base.

162 electrical vias through base.

163 integrated photodiode sensor 164 optical column region 165 lens 170 another example embodiment micro-array where objects are lens 171.

171 lens (transmissive optical elements).

180 light field directing system 181 laser source 182 alignment sensors 183 micro-array of present invention.

184 conical mirror directing laser beams out through lens 185.

185 lens focusing laser beams to target in field.

187 example deployment of multiple light field directing systems 180

190 example embodiment of optical-tweezer-based fabrication system 191 base surrounding operating volume 192 laser sources 193 multiple mirror arrays 194 operating volume (shown as vacuum chamber)

195 intersecting beams 196 material particles 197 microscope 198 micro-channels introducing particles into operating volume
200 example of wire flexure used in present invention
201 example of blade flexure used in present invention.

A. Flexure-Based Rotary Actuator (Lever Arm) Driven Micro-Array

Generally, in one example embodiment of the present invention, the flexure-based micro-array includes a plurality of micro-assemblies. And each micro-assembly includes an object to be actuated and at least three electrostatic actuation modules for tipping, tilting, and/or piston-actuating the object. Furthermore, each actuation module comprises: a base with first and second electrodes electrically isolated from each other; an electrically conductive lever arm; a first flexure bearing suspending the lever arm adjacent the first and second electrodes so that electrical activation of at least one of the first and second electrodes produces an electrostatic moment of force on the lever arm to resiliently bias the first flexure bearing and pivot the lever arm about a fulcrum; and a second flexure bearing connecting the lever arm to the object at a connection location that is different from other connection locations of the other actuation modules so that pivoting the lever arm about the fulcrum induces the second flexure bearing to pivot the object about an object pivot axis defined between two of the other connection locations while the second flexure bearing decouples the lever arm from object displacements induced by two of the other actuation modules connected to the two other connection locations defining the object pivot axis. And the plurality of micro-assemblies are arranged with the objects juxtaposed in a substantially 2D array.

FIGS. 1-18 show two embodiments the flexure-based rotary actuator-driven micro-array, one having 3 actuation modules (FIGS. 1-7) and the other having 4 actuation modules (FIGS. 8-18).

Object to be Actuated

The actuated object may be a motion stage, a mirror, a transmissive optical element, or any other body. It is "suspended" using decoupling flexure bearings which may include one or more flexures (e.g. wire flexure shown in Figure connected to actuation pads.) The mirror may optionally be ribbed to reduce bending and structural resonances. The objects may be micro-mirrors forming a micro-mirror array composed of a grid of micro-mirrors, which may be dimensioned, for example, 1 mm$^2$ surface area and about 5 um thickness. These mirrors are shown having a hexagonal shape with six sides, and may be made of a silicon core with a reflective surface coating.

At Least Three Electrostatic Actuator Modules

And each actuation module includes a base with first and second electrodes electrically isolated from each other; an electrically conductive lever arm; and a first flexure bearing suspending the lever arm adjacent the first and second electrodes so that electrical activation of at least one of the first and second electrodes produces an electrostatic moment of force on the lever arm to resiliently bias the first flexure bearing and pivot the lever arm about a fulcrum.

Each actuation module also includes a second flexure bearing connecting the lever arm to the object at a connection location that is different from other connection locations of the other actuation modules so that pivoting the lever arm about the fulcrum induces the second flexure bearing to pivot the object about an object pivot axis defined between two of the other connection locations while the second flexure bearing decouples the lever arm from object displacements induced by two of the other actuation modules connected to the two other connection locations defining the object pivot axis, wherein the plurality of micro-assemblies are arranged with the objects juxtaposed in a substantially 2D array.

The actuator modules may be bi-polar rotary comb-drive electrostatic actuators, which are located on the backside of each object to be actuated (actuated object). These actuators work on the principles of electrostatic attraction. The actuator arms (or actuator pads) are composed of ridges, or vertical comb 'fingers' made of conductive silicon. Each rotary comb-drive actuator has combs located on either side of the horizontal rotary axis (shown as the line labeled $R_{pad}$), so it can be rotated in either direction even though the comb drives only produce an attractive force. It is appreciated that "at least three electrostatic actuation modules for tipping, tilting, and/or piston-actuating the object" covers all manner of operations, even piston-only operation. It is appreciate that the lever arm is preferably symmetric about the pivot axis.

Base with Electrodes

The individual bases of the actuation modules are where the electrodes are found, and may be fused, bonded, or otherwise securely affixed together to form a unitary lower base plate. Or in the alternative the individual bases may be regions of a monolithic base block upon which all electrodes are formed. Additionally, as shown in the drawings, the base (or in the alternative the monolithic base block) may be considered just the portion upon which the electrodes are formed, or a combination with via plates and even the PCB. It is appreciated that the base layout may have a radial arrangement of electrodes: "wherein the electrodes of each base are radially arranged with respect to the mirror's reference axis." So that one is an inner electrodes and the other is an outer electrode. As seen in the figures, a radially inner one of the electrodes actuates an inner section of the lever arm which is connected to the flexure strut connecting to the object. In the alternative, the radially outer one of the electrodes and the radially outer section of the lever arm may be connected to the flexure strut connecting to the object.

Lever Arms

Generally, the lever arms are electrically conductive. In one embodiment, the lever arms are electrically grounded, such as by traces routed through the anchor. In another embodiment, the lever arms may be held at a constant negative charge, such that applying a positive or negative charge on an electrode, will produce attractive and repulsive forces, respectively. It is appreciated that "electrical activation of at least one of the first and second electrodes" means applying a voltage to produce an electrostatic charge on the electrode. Furthermore, a charge may be differently applied (positive or negative) to both electrodes to precisely control the electrostatic moment of force that is induced on the lever arm.

First Flexure Bearing Suspending Lever Arm Over Electrodes of Base—(Enabling Actuator Pad to Rotate about Pivot Axis)

The lever arm is suspended by a first flexure bearing so that it is positioned adjacent the first and second electrodes. The first flexure bearing may be anchored to the base or something else, e.g. a separate anchoring frame that is different from the base, but is otherwise fixed relative to the base. This first flexure bearing which guides the lever arm is able to directly resist the rotational snap in that most comb drives are subject to without significantly increasing the main rotational stiffness of the actuator. This is also done in a small area, thus maximizing the usable area for the comb actuation.

The first flexure bearing is shown comprising torsional blade flexures and stabilizing flexures. The torsional blade flexures operated to guide rotational motion of the lever arm. And the stabilizing flexures inhibit the pads from rotating about the desired axis. It also inhibits the pads from rotating about an axis perpendicular to the plane of the pad as well as from translating along the plane of the pad perpendicular to the plane of the torsional blade flexures, which can significantly reduce the performance of the design.

By adding the stabilizing flexures (which may be blades or wire flexures and may be on the top, middle or bottom plane of the rotary comb pads), the pads may only rotate about the desired rotational axis and thus many more combs may be packed within the underside of the pad to produce more torque and thus speed of the mirrors. The stabilizing flexures must be stretched along their axis for the comb drive to snap in, which means that undesirable motion has a high associated stiffness. This snap in force is typically what limits the actuator max force. The increased stiffness of this bearing, (which may be greater than 10× that of the rotary flexures alone), means the actuator can be run at several times the normal electrostatic field energy density than typical comb drive actuators. This results in much higher actuation forces. The stabilizing flexures also do not occupy a large area, thus avoids reducing the available area for combs. It may be positioned along the edge of the actuator, which does not interrupt the comb array. The stabilizing flexures are also designed to be easily micro-fabricated as they are planar.

It is appreciated that "fulcrum" is the pivot axis of the lever arm. Therefore "off-axis locations from the fulcrum" means locations on the lever arm that are spaced/removed from the pivot axis of the lever arm. And it is appreciated that the horizontally-aligned blade flexures may be two pairs of horizontally-aligned blade flexures, with one pair connecting one of the anchors to two symmetric off-axis locations from the pivot axis, and the other pair connecting the other one of the anchors to two other symmetric off-axis locations from the pivot axis. The stabilizing flexures connect the anchors to the lever arm at off-axis locations from the actuator pivot axis to additionally constrain the lever arm against parasitic motion. And the torsion hinge blade flexures may be vertically-aligned, and the stabilizing flexures may be horizontally-aligned blade flexures. Also, the stabilizing flexures may be either blade flexures or wire flexures. If blade flexures, preferably horizontally-aligned. The lever arm may also be characterized as "actuator paddles"

Second Flexure Bearing, Connection to Connection Locations on Object

The second flexure bearing of each actuation module connects the lever arm to a connection location on the object that is different from other connection locations of other second flexure bearings. The second flexure bearing decouples the actuators' output motions on the mirror such that a rotation of the mirror caused by one rotary comb pad is not influenced by any other rotary comb pad. This decoupling of the actuators outputs significantly reduces the complexity of calibration and command signal generation.

Second Flexure Bearings are Hexapod Flexures

In one example embodiment the second flexure bearing has a substantially triangular truss-shape having a wide base at the lever arm and an apex (e.g point connection) at the object connection location. Furthermore, the second flexure bearing may be hexapod flexures, i.e. six (3 pairs of) wire flexures having six (3 pairs of) point connections to three lever arms. The hexapod flexures stiffly transmit forces from the rotating pads to the mirror causing it to move. Each set of hexapod flexures attached to a single pad consist of two wire flexures that form a truss-like triangle. This shape provides a large stiffness to weight ratio along the axis in which the flexures push and pull. This flexure configuration can thus be resistant to buckling but will minimize the amount of flexure mass moving in the system thus increasing the system's speed.

The hexapod flexures also decouple the input of the rotary comb pads in that when one pad moves, the other pads do not move thus reducing the amount of actuator mass that moves during operation and increasing the system's speed. Such decoupling also prevents unwanted harmful forces from being transmitted to the actuation pads increasing their life. This design also decouples the inputs to the mirror stage. This means that the motion of the mirror stage does not result in damaging motion of each of the actuators that could cause snapping or pull-in. Comb drive actuators can only safely be allowed to move in one axis, other motions generally result in the combs coming closer together and pull-in occurs. The decoupling of the inputs solves this issue by ensuring multi-axis motion of the mirror is only seen by the actuator as single axis motion in the desired direction, avoiding issues with pull-in. This decoupling also reduces the moving mass for each axis of motion of the mirror stage, improving the device dynamics.

The three triangles formed by the six wire flexures of the hexapod are shown arranged with the same symmetry as the hexagon, which is the highest degree of symmetry for space-filling polygons, thus minimizing parasitic or unwanted kinematic motion errors of the mirror. This symmetry further simplifies the control of the mirror significantly.

And the position of each triangular set of hexapod wire flexures allows the design to achieve a large mechanical transmission. Note that if the triangular blue hexapod wire flexures are moved close to the center of the mirror such that D is large and L is small, the mirror will be able to rotate over a large angle but will not have access to large torque capabilities (thus low speed). If, however, these wire flexures are moved close to the edge of the mirror such that D is small and L is large, the mirror won't be able to rotate over a large angle but will have access to large torque capabilities (thus high speed). The reason is that the hexapod flexures have been designed to possess a double transmission effect. As they are moved, L will either increases while D decreases or vice versa. Since the rotary comb pad's axis of rotation is at the edge of the hexagon the total transmission distance (D+L) has been maximized so that designers may access a large range of tip-tilt strokes and speeds.

And the decoupling allows all of the actuators to act on the stage in parallel, meaning that the dynamics of all of the axes can be made identical. This is faster and easier to control than serial designs like gimbaled mirrors.

It is appreciated that the connection points are located on the object so that no three connection points are co-linear or define a plane that is substantially parallel to the reference axis of the object. This is because since actuation of the object at any one of the connection points is performed by rotating the object about a pivot axis that is defined by two of the other connection points. And pivoting the lever arm about the pivot axis urges/induces the connection point of the object substantially parallel to the reference axis of the object, i.e. "displaces the respective connection points of the object substantially parallel to the reference axis of the object."

It is appreciated that the connection locations, e.g. connection points, on the object are spaced from a reference axis e.g. z-axis of the object, and from other connection points of other flexure bearing struts. And any three of the connection points define a plane not parallel with the reference axis.

Second Flexure Bearings are Angled Arm Flexure Connecting Lever Arm to Object

The decoupling transmission flexure shown as the angled arm flexure passes through the actuator force to the mirror with precise constraint, and does so with a geometrically adjustable transmission ratio. This design's importance lies in the fact that it provides the benefits of a transmission without the common drawback of an underconstrained design. At the point of contact with the mirror, the transmission allows tip and tilt motions of the mirror stage without altering the position of the actuator, but passes through the vertical displacement generated by rotating the actuator. The flexures are stiff in the axis that they pass actuation force along, while they are compliant in all other directions. This means the actuation load is seen by the mirror as a vertical force slightly off from the center of the mirror. When this is done by four actuators, it produces sufficient control to set the tip, tilt and translation of the mirror stage. The transmission allows for a stacked design with an actuation plane and a mirror plane, so that the actuation forces can be maximized. The size of the transmission can also be adjusted to change the transmission ratio, thus altering the range of the mirror stage. This is all done without leaving significant intermediary masses free to oscillate, as would occur with an underconstrained design.

It is appreciated that a "blade surface substantially orthogonal to the fulcrum" means that the pivot axis defined by the fulcrum is substantially orthogonal to the plane defined by the blade surface, and the "blade surface substantially parallel to the fulcrum" means that the pivot axis defined by the fulcrum is substantially parallel to the plane defined by the blade surface.

It is appreciated that in the case where the modules have discrete bases (i.e. not part of monolithic base block), the base and the lever arm of each actuation module can together form a substantially rhombic-prism-shaped unit in radial arrangement with the other two substantially rhombic-prism shaped units so that three major axes of the substantially rhombic-prism-shaped units intersect at equal angles to each other."

Array Operation—by Rotary Actuation

The rotary motion is converted into another rotary motion on the plane of the hexagonal mirror. Note from the figure that if the combs from the section labeled 1 in this figure are provided a voltage the green pad will be pulled downward as shown by the black arrow. This will cause the pad to rotate about the axis labeled $R_{pad}$ in the figure. As the green pad rotates, a force is transmitted stiffly through two of the hexapod flexure beams to the yellow mirror causing the mirror to rotate about the axis labeled $R_1$, which intersects both intersection points of the other hexapod flexure beams. If the combs from the section labeled 2 in the figure had been provided a voltage, the mirror would rotate about the same axis, $R_1$, but in the opposite direction. In this way, each of the three actuator pads may individually contribute a single rotation of the mirror (in either direction). Note that section 1 causes $R_1$, section 3 causes $R_3$, and section 5 causes $R_5$. As each of these pads rotates various amounts, the mirror may not only achieve rotations about these three rotation lines, but it may also achieve any combination of them. For instance, the mirror may translate out of plane (i.e. piston motion) and it may rotate about any line in the plane of the mirror including the desired tip and tilt DOFs.

Electrical Connections and Control

The combs from the plate that mesh with the combs on the underside of the electrically grounded green pads shown in the same figure, receive their voltage through vias that are filled with conductive material that extend from the combs through the thickness of the red plate to electrical traces on the back. These traces are then flip-chip bonded to a PCB containing the drive circuitry for the mirrors. This circuitry applies voltages or charges to the traces to generate forces on the mirror. The three rotary comb-drive actuators enable torques to be generated as well as an out-of-plane force to drive the mirror vertically.

During operation, the actuators can be driven using digital commands from an FPGA located at the back of the array. This controller sends out a series of binary commands which are used to apply a set amount of positive or negative charge to the rotary comb pads to actuate the mirror. Vias also extend through the red plate to electrically ground the green rotary pads. The switching frequency will be ≈500 khz, roughly 10× higher than the operational frequency of the device. This enables any actuation force to be generated with only simple binary commands through pulse width modulation The three actuators will each be driven up to roughly 200 V of charge, which will produce torques of about 250 nNm per actuator, sufficient to drive the micromirror at about 15 kHz for 10° steps or about 40 kHz for 1° steps.

It is appreciated that "electrical activation" means connecting the electrode to an electric potential, voltage source (either negative or positive). This means that electrical activation of one of the first and second electrodes will produce an electrostatic moment of force (i.e. a net electrostatic moment of force) on the rocker arm to rock the rocker arm about the pivot axis. So that electrical activation of the first and/or second (i.e. one or both of) electrodes produces a net positive or net negative electrostatic moment of force on the rocker arm to rock the rocker arm about the pivot axis. For example, activating one of the electrodes at +3V while holding the other at neutral potential Hexagonal Shape of Object Hexagon shape—the object, e.g. mirror, may be shaped like a hexagon. Both squares and hexagons are space filling polygons enabling them to cover an entire surface with a high fill-factor. The regular hexagon is, however, a better choice than a square for two major reasons. First, it possesses more planes of symmetry and symmetry is always a hallmark of better design. Second, its rotational moments of inertia (e.g. the combinations of the tip and tilt DOFs) are more similar than a square's moments of inertia. A circle would have the same moments of inertia about every possible rotary axis through its center, but a circle cannot fill space. A hexagon can fill space and is most like a circle of the space-filling regular polygons. This fact makes the control of the hexagon mirrors less complex. Thus the optimal mirror shape is a hexagon.

Constraint Design Considerations

The constraint design considerations of the mirror array system is a major feature in enabling the mirror's superior performance capabilities. Most existing mirror arrays are designed with more DOFs than are necessary (often 6 DOFs) and possess elements which are tremendously underconstrained. Such design mistakes impact the dynamic performance of the mirrors substantially and require that the control system compensate for the poor mechanical design. Higher order harmonics limit the operating bandwidth, as the harmonics must not be driven if accurate motion is required. When the device is underconstrained, these higher order harmonics occur at frequencies comparable to the natural frequency of the DOF, strongly limiting the high speed performance of the device. When the system is properly constrained, the higher order harmonics are forced to occur along the high-stiffness axes of the flexural linkages, which can be orders of magnitude stiffer than the compliant directions of the linkage, and thus raise the harmonics to significantly higher frequencies.

In the present invention, each moving mass is designed with and only with the intended number and type of DOFs. In other words, the rotary comb pads may only rotate about their intended axis and the mirror may only possess 3 DOFs (tip, tilt, piston and every combination of those 3 motions). Furthermore, each of the rigid masses are not underconstrained. This means that if the mirror were held fixed with respect to the via plate with combs, the rotary comb pads would be fully constrained and would not possess any stray DOFs with which to vibrate. Likewise, if all three pads are held fixed relative to the via plate with combs, the mirror is exactly constrained to not move by a steward platform configuration of wire flexures. This exact constraint will reduce stress build up and will allow for imperfections in the fabrication of the flexures because no constraint is doing the job of any other constraint. Finally, the effective constraint from the flexures that guide each rotary comb pad combined with each pair of triangular wire flexures within the hexapod each act like a single wire flexure oriented (each of the three legs of actuation contribute a single wire flexure making 3 effective wire flexures). In this way the flexures act to not only decouple the actuators, but to provide symmetric and exact constraint for guiding the mirror with its intended 3 DOFs. The actuation legs lie entirely below the mirror allowing the mirrors to be packed as tightly as possible allowing for almost a perfect fill-factor on the top mirrored surface.

The rotary comb actuation lever arms of the present invention are symmetric and push on the mirror along stiff directions in a symmetric, centered way. The symmetry of the pads allows them to behave like a see-saw, which requires minimal energy to rotate.

Second, the rotary comb structures may be capped on their finger ends and on their top surface by a flat plate. This double capping feature strengthens and stiffness the combs substantially so that many more combs may be packed in the same space producing a much larger torque and mirror speed than existing designs. The end caps stiffen up the flexures along their long axis by about 48×, owing to the anchoring at both ends. The roofing of the combs shifts their dominant bending mode to be along the much shorter vertical vs. in plane direction, raising the stiffness by about 45× further. The flat surface on top of the combs also provides a surface onto which the hexapod may be securely bonded.

The capped comb geometry may created by linking together the tips of each of the combs so that they form an enclosed grating rather than the standard exposed fingers. This significantly improves the pull-in stiffness of the actuator, allowing it to be run at significantly higher energy densities. The capped combs design offers a significant advantage for electrostatic actuation. By linking the tips together with a cap, and anchoring this cap with comb tip supports, the far end of the combs can be treated as rigidly locked equivalently to the base of the comb. This removes the lowest order most compliant mode of the combs, tip deflection. With the end locked, the deflection must occur via a significantly stiffer mode of center deflection, shown in the same figure as Capped Comb. The increase in stiffness may be roughly 50-fold, meaning that much higher pull-in forces can be tolerated prior to pull-in. The force limit for comb drives is generally the pull in voltage. The capped combs design increases the voltage that the actuators can be run up to, meaning more torque can be generated from each actuator. This allows the mirror design to be run significantly faster than non-capped actuator designs.

The symmetric, evenly spaced traces and vias on the back of the via plate not only enable the present invention to pull the electronics out the back of our design thus enabling unbounded array sizes, but it also enables much of our mirror's simple electronics and non-complex control design. Symmetry makes for clean design through which many problems are filtered. Note from the figure that each rotary comb pad requires two symmetrically placed vias (the traces of which are circular in the figure). Hexagonally-shaped traces electrically ground the rotary comb pads through other vias.

The via plate is empty in the center below each mirror such that future designs can include one or more lasers of various colors and types to be placed in that location. For such a design, the hexagonal mirror could be replaced with a lens of optimal shape for directing and modulating the light waves (or any other electromagnetic wave) in desired directions. The laser would be provided voltages through vias in the via plate just like the actuators. An example lens mounted on our internal light source design.

The design lends itself to a novel fabrication process, which combines standard lithography as well as novel additive fabrication 3D printing processes. The typical micromirror process involves surface micromachining on a single wafer, however some micromirror designs include multi-wafer assembly. This process is indicated by the exploded view of the mirror. The process includes making the ground plate as one wafer, the actuation plate as a second wafer, and the hexagon mirrors as a third wafer. The mirrors are generated on the surface of a handling wafer, then the hexapod flexures are fabricated via a 3D printing process onto the back of the mirrors. This produces an array of mirrors facing into the handling wafer, with an array of hexapod flexures anchored to their exposed underside. The bottom part of our array is fabricated separately. This part is done in two parallel processes—the actuation plate, and the grounding plate, then the two are aligned and fused. By keeping these wafers separate, the fabrication process can be simplified, and both mechanical structures can be made from single crystal silicon using bulk micromachining processes. This would not be possible with the more common surface micromachining processes. The alignment and bonding of the actuation and ground wafer generates the bottom half of the micromirror. The mirrors/hexapod flexures are now bonded to the exposed surfaces of the paddles. These are restrained from moving via 3D printed structures that are later etched away. This whole process keeps each substructure fabrication separate from the others until the last possible step. This method of creating the micromirrors significantly simplifies the process development as it avoids common problems with temperature, pressure and chemical compatibilities.

In a four actuator module embodiment, the mirror array may be composed of a square grid of 1×1 mm mirrors, each roughly 10 um thick. These mirrors will be composed of a silicon core with a reflective surface coating. These mirrors will have flexure bearings anchoring them to the main display structure. Each of the flexures will be located on one side of the square mirror. The flexures will allow the mirror to tip and tilt as well as move out of plane with large ranges. The flexures are also thermally insensitive and provide a high fill-factor. A thin piezo film could also be deposited on the surfaces of these flexures to increase the actuation force of the design. The electrical wiring to these films would be routed down the posts of the array to the PCB in the back of the device.

Each rotary axis is controlled by two rotary comb drives (i.e. diametrically opposing quadrants). By driving one upwards and the other down, the mirrored surface is forced to rotate. The two rotary comb drives can be alternately driven synchronously upwards, forcing the mirror to translate without any rotation. The flexure transmission element decouples the rotary motion so that the two rotary comb drives not involved in generating the motion are not affected. These flexures decouple the two axes, so the performance of each of the four rotary comb drive actuators does not depend on the multi-axis motion of the mirror, but rather only on their own single-axis motion. This significantly reduces the complexity of calibration and command signal generation. Four blade flexures positioned on two intersecting planes constrain the shuttle of the rotary comb to only rotate about the desired axis.

The actuator pads are linked with through silicon vias to bond pads on the back of the via plate. These pads are then flip-chip bonded to a PCB containing the drive circuitry for the mirrors. This circuitry applies voltages to the pads to generate forces on the mirror. The four rotary comb-drive actuators enable torques to be generated as well as an out-of-plane force to drive the mirror vertically.

During operation, the actuators are driven using digital commands from an FPGA located at the back of the display. This controller sends out a series of binary commands which are used to apply a set amount of positive or negative charge to the actuator pads on the base plate. The mirrors side of the actuators are grounded through the mirror support posts. The switching frequency will be roughly 10× higher than the operation of the device, about 300 khz. This enables any actuation force to be generated with only simple binary commands through pulse width modulation.

The two actuators for each axis will be driven up to roughly 200 V of charge, which will produce torques of about 90 nNm per actuator, sufficient to drive the micromirror at about 11 kHz for 10° steps or about 35 kHz for 1° steps.

The LDA contains a number of unique features that enable its high performance.

The mirror guiding first flexure bearing may be important for several reasons. First, the precise constraint is important to guarantee that the mirror is not vibrating during operation, especially in-plane, this could cause mirror components to hit one another in high fill-factor arrays, resulting in the destruction of the mirrors. The lack of these low frequency harmonics means the control bandwidth can safely be pushed up to higher frequencies, resulting in a faster device.

The folded back design maximizes range while utilizing the minimum possible area, as any area used for the flexures does not reflect the light in the correct direction. This allows more motion than single blades coming out each side. This means the mirrors can be made to operate over a larger range than previous designs.

The folded design also improves thermal stability as when both beams heat up, the motion is canceled out. This allows for smaller gaps to be placed between mirrors, improving the fill-factor. This means more laser power can be directed by the array without damaging the LDA.

The use of a wire flexure instead of another blade reduces the size and stiffness of the bearing. The second blade does not add any constraint and simply uses up more of the surface of the mirror [4]. By replacing it with a wire, the mirror becomes easier to rotate and reflects more of the light in the desired direction. The lower stiffness means that more of the actuation effort can be directed to moving the mirror inertia, thus letting the device run faster.

3 Actuator Embodiment—Rhombus Shaped Actuators

The rhombus-like shape of the lever arm provides a space filling polygon that makes use of every bit of space below the mirrors, it also enables the most efficient packing of long combs that maximize the moment arm of the actuator from the axis of rotation to the point where it engages the mirror. This geometry boosts the torque capabilities imposed by the mirror significantly. Furthermore, the rhombic-shaped pads create symmetry and packing characteristics, which allow the actuators of one mirror to spill into the space of its neighboring mirrors as shown in the figure, thus maximizing the moment arm of the actuators as mentioned. It is this rhombic packing that also enables the maximized transmission length. This maximized length provides the largest range of tip and tilt strokes as well as torques imposed on the mirror.

It is appreciated that the lever arm is described as having a "rhombus shape", but b/c it is a three-dimensional shape with depth/volume, it may also be characterized as having a rhombic-prism shape. And the rhombic prism has two rhombus bases and four rectangular sides 4 Actuator Embodiment—Triangular/Trapezoid Symmetric Actuators The substantially trapezoid-shaped (or generally, a triangular shape) symmetric actuator design (both lever arms and electrode quadrants) are shaped to occupy one quarter of the available area (with longer bases together forming an outline of a square), to rotate around a non-centered axis of rotation, and are optimized to have the maximum force generation of either side of the rotational axis. The geometrical layout of these actuators provides several advantages. The triangle shape maximizes the use of the area under the mirror. It maximizes the usable area for actuation, and approaches the highest actuation density possible for a square design. The design also leaves the corners available for use as a structural hard point to rigidly hold the structure in place. The axis of actuator rotation is shown in the figures off from the center of the actuator area. This has been deliberately shifted to balance the maximum torque generation from either side so as to produce an equal ability to push and pull with each actuator.

The trapezoid shape of the structure rigidifies the capped comb design. If the combs are assumed to have no innate stiffness, then the outer material linking the comb tips together must be as rigid as possible to avoid any bulk comb deflection. A triangular/trapezoidal outline is innately more rigid than a square outline, which can easily deform. This provides a significant boost to the rigidity of the comb tip anchors.

The symmetry of the anchoring points for the actuator guide flexures reduces the effects of both thermal and mechanical loading on the structure. The actuator does not move as it is heated, as both sides of the actuator are subjected to the same conditions. This avoids any issues with thermal pull-in. The mechanical loading on the hardpoints are also largely canceled by the symmetry of the design. Each hardpoint is loaded by eight actuators (two shown in FIG. 13, and six more for the other three mirrors around each corner), whose net effect is to pull the hardpoint down without any dominant sideways load that might break the adhesion to the wafer below. It is appreciated that a "substantially trapezoid-shape" may also be characterized as a "substantially triangle shape" as the shorter of the two trapezoid bases (i.e. the distance between the trapezoid legs) is minimized.

Integrated Optical Circuit

The integrated optical circuit in another example embodiment is composed of a combination of light sources/sensors fabricated onto the surface of the blue via plate, as well as a light directing component, such as a lens, located on the mirror stage. This is placed in the center of the micromirror device in between the decoupling transmission flexures. The fabrication process of the present invention, of stacked etched wafers simplifies the implementation of this optical circuitry as it can be created on the via/actuation plate without altering the fabrication of the other components.

The integration of the optical circuit into the micromirror device itself allows the device to emit and capture light without the need for a separate source/sensor. This means applications light 3d image capture/generation can be made significantly simpler and more robust as the integration removes the need for precision alignment of the light source/sensors to the LDA.

The optical circuit is built into the center of the mirror design to act as a pixel with intensity, color (if sufficient light sources/sensors are used) and directional information capture. The red and blue actuation/via plate would be modified to contain the source/sensor, and could be altered as required by the application without changing the design of the rest of the device. The micro-lens on the mirror stage could likewise be fabricated as part of the mirror process without altering the other steps in the development. This aspect of the optical circuit could be redesigned for increased range or resolution as the applications require.

The decoupling transmission flexures are designed to keep the center of the LDA hollow to leave space for the integrated optical circuit. The use of the center of the mirror improves the dynamics as the lens inertia is centered on the rotational axes, and thus has the lowest possible inertia.

In another embodiment, the mirror array may be composed of a square grid of 1×1 mm mirrors, each roughly 10 um thick. These mirrors will be composed of a silicon core with a reflective surface coating. These mirrors will have flexure bearings anchoring them to the main display structure. Each of the flexures will be located on one side of the square mirror. The flexures will allow the mirror to tip and tilt as well as move out of plane with large ranges. The flexures are also thermally insensitive and provide a high fill-factor. A thin piezo film could also be deposited on the surfaces of these flexures to increase the actuation force of the design. The electrical wiring to these films would be routed down the posts of the array to the PCB in the back of the device.

In one example embodiment, four bi-polar rotary comb-drive electrostatic actuators are located on the backside of each mirror. These actuators work on the principles of electrostatic attraction. The actuator pads are composed of ridges, or vertical comb 'fingers' made of conductive silicon. Each rotary comb-drive actuator has combs located on either side of the horizontal rotary axis, so it can be rotated in either direction even though the comb drives only produce an attractive force. The rotary motion is converted into a vertical motion on the back of the mirrored surface through a jointed flexural arm linking the actuator to the back of the mirror. The four bi-polar rotary comb-drive electrostatic actuators are shown in this design with a triangular configuration. It would also be possible to pack them using different configurations such as overlapping rectangles etc. Each rotary axis is controlled by two rotary comb drives (diametrically opposing quadrants). By driving one upwards and the other down, the mirrored surface is forced to rotate. The two rotary comb drives can be alternately driven synchronously upwards, forcing the mirror to translate without any rotation. The flexure transmission element decouples the rotary motion so that the two rotary comb drives not involved in generating the motion are not affected. These flexures decouple the two axes, so the performance of each of the four rotary comb drive actuators does not depend on the multi-axis motion of the mirror, but rather only on their own single-axis motion. This significantly reduces the complexity of calibration and command signal generation. Four blade flexures positioned on two intersecting planes constrain the shuttle of the rotary comb to only rotate about the desired axis.

The actuator pads are linked with through silicon vias to bond pads on the back of the via plate. These pads are then flip-chip bonded to a PCB containing the drive circuitry for the mirrors. This circuitry applies voltages to the pads to generate forces on the mirror. The four rotary comb-drive actuators enable torques to be generated as well as an out-of-plane force to drive the mirror vertically.

During operation, the actuators are driven using digital commands from an FPGA located at the back of the display. This controller sends out a series of binary commands which are used to apply a set amount of positive or negative charge to the actuator pads on the base plate. The mirrors side of the actuators are grounded through the mirror support posts. The switching frequency will be roughly 10× higher than the operation of the device, about 300 khz. This enables any actuation force to be generated with only simple binary commands through pulse width modulation.

The two actuators for each axis will be driven up to roughly 200 V of charge, which will produce torques of about 90 nNm per actuator, sufficient to drive the micromirror at about 11 kHz for 10° steps or about 35 kHz for 1° steps.

B. Side Blade Flexure-Anchored Micro-Array

4 Actuators, w/ Vertical Comb Drive, and Using Mirror with Novel Side Flexure Bearing The present invention is also directed to a flexure-based micro-array where the actuated object (e.g. mirror or motion stage) is suspended by means of the side flexure bearing on sides of the object/mirror.

The mirror array may be composed of a square grid of 1×1 mm mirrors, each roughly 10 um thick. For example, these mirrors may be composed of an aluminum core with a reflective coating on the surface. These mirrors will have 4 blade flexures anchoring them to the main display structure. Each of the flexures will be located on one side of the square mirror. The flexures will allow the mirror to tip and tilt as well as move out of plane with large ranges. Each of the possible motions will have an inherent stiffness associated with it, due to the elasticity of the flexures. The rotational stiffness will be roughly 300 nNm/rad. The moment of inertia of the polymer mirror about both rotational axes will be roughly $3 \cdot 10^{-15}$ kg·m². The flexures are also thermally insensitive and provide a high fill-factor. A thin piezo film could also be deposited on the surfaces of these flexures to increase the actuation force of the design. The electrical wiring to these films would be routed down the posts of the array to the PCB in the back of the device.

Four comb-drive electrostatic actuators are located on the backside of each mirror. These actuators work on the principles of electrostatic attraction. The actuator pads are composed of ridges, or comb 'fingers' which are coated with two layers-a conductive layer underneath and an insulating layer on top. This allows the surface of the ridged pads to be charged, but the charge cannot be lost if the ridges come in contact with another conductor since an insulator covers the conductive layer. The combs are depicted as straight, square combs. For example, fingers are shown in detail and are 200 um tall, 10 um wide, 1 mm long, separated by a 110 um gap. 3 sets of ridges will be used for each actuator pad on the mirror array. The corresponding pad on the backplate will have 4 fingers aligned as shown below. The fingers will overlap by roughly 100 um once assembled. This is slightly larger than the 87 um of rise and fall seen at the edges of the mirror plate due to full 10° tilting. The gap between fingers will be 50 um once the two parts are aligned relative to one another. The 10° tilt causes the furthest tip of the moving comb fingers to reduce the 50 um gap down to 8 um.

The actuator pads are linked with thin metal traces to drive circuitry on the back of the display. This circuitry applies voltages to the pads to build up controlled amounts of charge on the pads. The charge on the pad is read and maintained with a charge amplifier, enabling charge based control of the actuator. This avoids issues with pull-in and increases the range of the actuator. Two actuator pads are able to drive each degree of freedom, given their alignment relative to the axes of rotation.

The actuator pads may be linked with through silicon vias to bond pads on the back of the via plate. These pads are then flip-chip bonded to a PCB containing the drive circuitry for the mirrors. This circuitry applies voltages to the pads to build up controlled amounts of charge on the pads. This avoids issues with pull-in and increases the range of the actuator. The four actuator pads enable torques to be generated as well as an out-of-plane force to drive the mirror vertically. The mirrors side of the actuators are grounded through the mirror support posts. The switching frequency will be roughly 25× higher than the operation of the device, about 100 khz. This enables any actuation force to be generated with only simple binary commands through pulse width modulation.)

During operation, the actuators are driven using digital commands from an FPGA located at the back of the display. This controller sends out a series of binary commands which are used to apply a set amount of positive or negative charge to the actuator pads on the base plate. A constant negative charge is kept on the pads on the mirror. If a positive charge is placed on the lower pads, then the actuator produces an attractive force, pulling one side of the mirror down. If a negative charge is placed on the lower pads, then a repulsive force is generated, pushing that side of the mirror up. By varying the relative frequency of positive to negative commands, any value between full positive and full negative can be commanded. The switching frequency will be roughly 25× higher than the operation of the device, about 100 khz. This enables any actuation force to be generated with only simple binary commands through pulse width modulation.

The two actuators for each axis will be driven up to roughly 100-150 V of charge, corresponding to 0.2 nC on each pad at 0° deflection. The magnitude of charge is maintained by the charge amplifiers. By varying the lower plate between +0.2 nC and −0.2 nC of charge, attractive and repulsive forces of 90 uN will be generated by each actuator. The two actuators together will produce a torque of 90 nNm, which is sufficient to drive the micromirror at about 4 kHz for ±10° amplitude oscillations. In practice, the motion of the device will generally be far less than this, as the projectile will follow a continuous path after initial lock on. This means the mirrors will be able to operate at least at 4 kHz settling rate for tracking the projectile. (12449—The two actuators for each axis will be driven up to roughly 100-150 V of charge, which will produce torques is sufficient to drive the micromirror at about 1.7 kHz for ±10° amplitude oscillations or about 5 kHz for ±1°.)

4 Actuators, w/Linear Comb Drive Actuator Shuttles Via Center Posts

The mirror array will be composed of a square grid of 1×1 mm mirrors, each roughly 10 um thick. These mirrors will be composed of a silicon core with a reflective surface coating. These mirrors will have flexure bearings anchoring them to the main display structure. Each of the flexures will be located on one side of the square mirror. The flexures will allow the mirror to tip and tilt as well as move out of plane with large ranges. The flexures are also thermally insensitive and provide a high fill-factor. A thin piezo film could also be deposited on the surfaces of these flexures to increase the actuation force of the design. The electrical wiring to these films would be routed down the posts of the array to the PCB in the back of the device.

Four linear comb-drive electrostatic actuators are located on the backside of each mirror. These actuators work on the principles of electrostatic attraction. The actuator pads are composed of ridges, or horizontal comb 'fingers' made of conductive silicon. Each linear comb-drive actuator can be engaged to generate motion in-plane along a single axis. The motion is limited to this single axis through a flexural bearing. The actuator motion is transferred to a post in the center of the device, which is connected to the back of the mirror. The actuator motion is engaged by applying a voltage between the comb fingers, and this causes the actuator to linearly move away from the post. The connecting flexure transfers the actuation force to the base of the post, acting to tug on the post and pulling it in the direction of the actuator motion. The four actuator shuttles are able to pull the base of the post in all in-plane directions. The mirror is restricted from translating in-plane, so the top of the post (where it is connected to the mirror) is unable to translate in-plane. This restriction converts the in-plane translation at the bottom of the post into rotations of the post. In this fashion, the actuators are able to generate bi-directional rotations in the reflecting mirror.

Each rotary axis is controlled by two linear comb drives, one for each direction of each rotational degree-of-freedom. The mirror can be driven in two axes of rotation, but cannot be translated vertically.

The flexure transmission element decouples the rotary motion of the mirror so that the two linear comb drives not involved in generating the motion are not affected. These flexures decouple the two axes, so the performance of each of the four linear comb drive actuators does not depend on the multi-axis motion of the mirror, but rather only on their own single-axis motion. This significantly reduces the complexity of calibration and command signal generation.

The actuator pads are linked with through silicon vias to bond pads on the back of the via plate. These pads are then flip-chip bonded to a PCB containing the drive circuitry for the mirrors. This circuitry applies voltages to the pads to generate forces on the mirror. The four linear comb-drive actuators enable torques to be generated on the mirror.

During operation, the actuators are driven using digital commands from an FPGA located at the back of the display. This controller sends out a series of binary commands which are used to apply an adjustable potential to the actuator pads on the base plate. The moving part of the actuators are grounded through the mirror support posts. The switching frequency will be roughly 25× higher than the operation of the device, about 200 khz. This enables any actuation force to be generated with only simple binary commands through pulse width modulation.

The two actuators for each axis will be driven up to roughly 150 V of charge, which will produce torques is sufficient to drive the micromirror at about 2.3 kHz for ±10° amplitude oscillations or about 10 kHz for 1°.

C. Light Shield—Application Using the Flexure-Based Micro-Array (any of Above Discussed Systems)

A high-speed light-field directing array (LDA) is provided capable of rapidly (<1 ms) directing light over large angles (>10°). The LDA enables a range of possible devices including in-flight bullet interception, fusion target tracking for high rate energy production in the LIFE program and true-3D image generation. The "light shield" system is configured to intercept, destroy, or deflect projectiles in-flight, preventing them from reaching their target. The light shield system is envisioned to operate only up to around 100 m, and so must operate at extremes in both speed and angular motion: between 1-100 ms to engage and divert the projectile, which could span angles of 20-40° during the time of engagement.

Technology presently exists to track a bullet's trajectory and extrapolate its location of origin. High speed systems are capable of identifying a bullets path before the bullet reaches its target. There is unfortunately nothing that can be done with this information at present, all bullet defenses are preventative (e.g. bullet proof vests) rather than reactive.

Various systems are known which utilize a high power laser, large mirror to aim the beam, and targeting equipment, for targeting and destroying missiles, UAVs and mortar shells. Such existing laser systems are designed to engage targets many kilometers away, over several seconds and with only very small angular corrections ($\approx 0.1°$) required at high speeds using adaptive optics. Due to their size and small angular range, however, existing laser systems are simply too slow for engaging targets, such as incoming bullets, often encountered at much closer engagement ranges (e.g. $\approx 100$ m range).

The light shield system is composed of a projectile tracking sensor suite, a high power laser source, an LDA and a wide view optical system of lenses. These components work to locate projectiles then heat and eventually deflect or destroy the projectiles, all as shown in FIG. 1. The importance of this design lies in its ability to carry out all projectile interception operations at sufficient speed to redirect the projectile before reaching its intended target, effectively shielding the target.

The light-field directing array forms the most critical component of the system as it is required to precisely place the laser energy on a rapidly moving object. The other components of the system are more mature technologies, requiring less development.

The light-field directing array must be capable of meeting a number of functional requirements, shown in Table 1, to make the projectile interception and other applications possible.

TABLE 1

Functional Requirements

| Requirement | Minimum | Desired | Units |
| --- | --- | --- | --- |
| Positioning in all directions | 2 | 2 | Axes |
| Angular range | 5 | 10° | ± ° |
| Array area | ≥4 | ≥20 | cm2 |

TABLE 1-continued

Functional Requirements

| Requirement | Minimum | Desired | Units |
| --- | --- | --- | --- |
| Stable positioning | 1 | 1 | Mirror/controller |
| Positioning Bandwidth | >1 | >5 | kHz |
| Fill Factor | >90 | >95 | % |

The continuous positioning capability in two axes is required in order to steer beam out at arbitrary angles over the full angular range of motion, so that the projectile can be targeted over a wide area. The angular range requirement is set by the need to cover all possible directions during operation, even with angular magnification optics. The area coverage requirement is set by the use of high power lasers, which must be diverged sufficiently to lower power flux and pulse fluence on the mirror array to non-destructive levels (<10° C. temp rise, <1 J/cm2). The requirement of active control for each mirror is determined by the need for high targeting accuracy during operation despite expected drift, creep and vibrations. This requirement places a lower bound on the mirror size, as upwards of eight traces must be routed out from each mirror, to allow control of each of the mirror's actuators. The fabrication difficulty scales with reduced mirror dimension, owing to the trace width and/or via areas required to route the signals out of the LDA. The positioning bandwidth of the array is a rough estimate determined by the need to align the beam (of diameter ≤0.15 m) to an object moving at $\approx 1000$ m/s. This is the closed loop frequency at which full range (+10°) angle commands can be reached by the system, before the next command is given. The fill factor of the array is set by the power losses from the laser source causing heating of the array. A higher fill factor is associated with more complete reflection of the beam and a reduction in the energy absorbed by the LDA. Closed-loop control of the mirrors will make it possible for the system to adapt to vibration or thermal disturbances with minimal impact on overall performance.

The operation of the light shield is described as follows:

Bullet tracking equipment picks up the signature of an incoming projectile, and the signals from several trackers are used to pinpoint the location of the projectile, as well as its trajectory. The trajectory is extrapolated into the zone covered by the light shield to see if it will intercept any vulnerable resources, such as personnel or equipment. The locations of these objects are gathered using commercially available real-time resource tracking system. If the projectile will intercept vulnerable resources, the system begins the engagement process.

A laser source (e.g. 1-2 kW) emits a rapid pulse of light, which is deflected by the mirror array to pass through the wide angle optics and impinge upon the projectile. The energy absorbed by the projectile acts to destabilize and damage it, causing the projectile to miss or be destroyed. A set of sensors placed around the laser head are used to look back along the optical path and locate the projectile as seen from its reflection on the mirror array, ensuring the system is correctly 'locked on' to the projectile target. Several deflection systems will be used, e.g. about 6, to reduce the collateral damage of the light beam while in use since the location of overlap is only at the projectile. Elsewhere, the power is significantly reduced.

The physics underlying the interception varies over the possible engagement ranges. Early calculations were carried out assuming a bullet traveling perpendicular to lasing sources of net 6 kW power at various distances. Figure shows the expected distance of bullet travel required before the bullet is deflected or destroyed vs the distance between the shield source and the bullet path.

Over the full range of engagement, the initial effect on the projectile is to cause it to tumble. This is caused by two main effects, a disruption of the turbulent boundary layer and a destabilization of the projectile due to ablation on its surface. The laser will cause rapid heating on the side facing the shield system. This heating occurs sufficiently quickly that the air expands explosively, generating a small shock wave on the surface. This shock wave destroys the low drag laminar boundary layer on the side of the bullet, resulting in a turbulent flow. Turbulent flow has about 4× the drag as laminar flow, resulting in an asymmetric drag profile that rapidly (20 m) causes the projectile to begin to tumble end over end. The ablation of material off the side also has a similar effect on the projectile, further generating tumbling. The projectile course can vary significantly once it begins tumbling. This varying trajectory would be monitored by the system and altered again should it show signs of still hitting the original target.

Other slower effects also contribute to the projectile deflection. This includes acousto-optical energy transfer through the shockwave generated on the projectile surface, and mass jet momentum transfer to the projectile through surface ablation. Both of these effects can alter the projectile trajectory, however they occur over longer time periods and larger ranges of about 40 m+. The projectile spacing of a machine gun firing at about 17 shots per second is also shown on the chart to provide comparative distances. The system would thus be able to cause each of the projectiles from a machine gun to deflect with enough time between to confirm deflection and begin tracking the next projectile.

While the present invention may or may not include the projectile tracking sub-system, such a projectile tracking sub-system is necessary for operating the present invention by providing input parameters which control independent actuation of the micro-mirrors. The invention adapted to receive input from a projectile tracking system (e.g. having a sensor, processor, and other electronics, for detecting and tracking a projectile in flight) and directing a laser beam to the LDA which actuates the mirrors to deflect the laser beam through a lens so that the laser beam converges upon a targeted location and trajectory in time.

D. Optical Tweezers—Second Novel Applications Using the Flexure Based Micro-Array (any of Above Discussed Systems)

Another application of the present invention utilizes a large array of high speed multi-axis micromirrors to control many light beams in parallel. These beams are used as optical tweezers to manipulate particles of various sizes from 10's nm up to a few 10's of microns. The manipulation consists of both generating forces to produce motion and depositing energy in the particle to sinter or anneal the material once it is at a desired location. This process is carried out in parallel by the multiple beams, which then allows for high rate material deposition to generate 3D structures that can be on the macroscale. Since the structures may be printed particle by particle, and since the device can control how much and how quickly each particle may be heated and cooled as well as the speed the that particle is brought into place, the device is able to control the material properties and grain structures of the materials on a nanoscale.

This process may be reversed to diss-assemble a structure by locally heating a section of it, removing the liquidifed material with optical tweezers and then testing the composition of the material. This would work especially well if the structure were fabricated using this device, and thus would be composed of a matrix of fused spheres. As an alternative, individual particles may be vaporized and the remaining vapor may be scanned to determine its composition. By storing the material information along with the positional information of the structure, a full 3D map can be generated from which the structure can be duplicated. This 3D computer model of the structure could be sent electronically to any other printer and replicated. The idea is similar to the concept of a 3D fax machine.

The mirrors and optics of the present invention may be arranged in such a way as to simultaneously manipulate such nano beads at an unprecedented rate ($10^7$ particles/s) of any material that may be funneled to the work space through micro-channels or sprays such that the beads may be stacked and sintered in place for the application of rapid multi-material nano-3D-printing. A possible instantiation of the concept is shown in Figures. We are developing and have patents here at LLNL for a micro-mirror array that significantly outperforms (packing density, speed, range, resolution) any existing array such that this technology and printing speed will be enabled here at the lab.

Applications for the proposed micro-mirror array include (1) Micromanufacture of metamaterials and composites (2) Bio assembly of living structures (3) Structural modification and repair of micro/nano structures (4) Manufacturing of devices with nano-structures (CNTs, Quantum Dots) (5) Destructive structural analysis (6) 3D Fax machine, 3d printing, Optical tweezers have been known for many years, since their description in 1970. This technology operates through multiple principles based on the size of the particle being trapped. For large particles, the light passing through the particle is refracted and leaves as an angle. This is a change in the direction of the light, and thus a momentum change. An equivalent momentum change is induced on the particle. This process forces a static equilibrium where the transparent particle is held in the light beam. For smaller particles that are dielectric, the electric field generated by the light dominates, and draws the particle to the center of the beam. In both cases, a trap is formed that holds the particle in the neck of the beam, where the beam reaches its smallest diameter. By moving this point around, the particle can be transported. This has been demonstrated for particles from the nanoscale up to microscale. Metallic particles have been trapped by modulating the radial intensity profile of the laser to form a low intensity zone in the center. The extensive research that has been done on optical tweezers has demonstrated that a wide variety of materials may be trapped and moved via this method.

At present, this process has only been demonstrated with small arrays (around 4) of mirrors [4], and these have only been used to move single particles around. Despite the kHz bandwidth of the mirrors, this rate is far too low for practical volumetric fabrication. Others have proposed using larger mirror arrays to manipulate a multiplicity of nano-tubes or other particles in parallel using the principles of optical tweezers. However these designs do not lend themselves to high rate manufacture due to the lack of certain features (X/Y/Z 3d particle transport, overlap of tweezer operating zones, multiple wavelength lasers, etc.).

The array-driven optical tweezer fabrication system utilizes the intersection of multiple beams (2 or more beams) to trap particles. This enables simple motion of the particle in all directions by shifting the intersection point of the beams. The beams will be focused to neck down to a near-minimum width over the whole operating volume to maximize the trapping force. The intersecting beams will originate from different micromirror arrays. Greater motion resolution in the vertical axis may be obtained by separating the source of these intersecting beams.

An optical probe laser will be used to confirm that a particle is trapped in each tweezer. This probe will consist of a laser of a wavelength that is reflected by the particle to be trapped. The probe is shined down the same optical path as the optical tweezer beam, however this wavelength is reflected. Confirmation of successful trapping may be gained by sensing for a reflection of this optical probe laser wavelength. As an alternative for sensing the particles location a multiplicity of microscopes may be used to triangulate the particles positions.

Each micromirror is capable of rotations in two perpendicular axes. The range of motion of the mirror is constrained to cover only a fraction of the operating volume of the printer. This is to maximize the positional resolution of each tweezer. Instead of having each tweezer operate over the whole volume of the printer, the tweezers will instead operate within smaller areas at higher resolution. Particles that must pass through these sub-volumes will be passed off between tweezers in a bucket-brigade-like motion. This enables large possible travel with high resolution once the particle reaches its final destination. The operating volume of each tweezer overlaps with the operating volumes of nearby mirror's tweezers. This is to ensure that active areas are capable of parallel operation.

A lens may be placed between the mirror array and the operating volume in order to focus the mirror reflected laser light into a large angle cone, thus having a large numerical aperture (NA). A high NA generates large trapping forces. The micromirrors may be given a convex shape in order to generate an expanding cone of light that is then focused by this single lens back to a tight neck within the operating volume. A single lens should be capable of refocusing the light from all of the mirrors on the array. This lens is not shown in the figures.

The operating volume may be shifted by a translational stage on which the structure is created. This allows for the total structure size to be decoupled from the operating volume of the optical tweezer printer.

The laser that is used to generate the beams for the optical tweezer effect is generated from a single source that is passed through a gate array before reflecting off of the micromirrors. This gate array, such as the Texas Instruments Digital Micromirror Device, enables control of the beam state (on/off) to each of the micromirrors. Thus certain tweezers can be turned on and off without affecting the others.

At least two lasers are shined in parallel onto the micromirror array. One of the lasers is set at a wavelength tuned to provide maximum momentum transfer to the particle, which is a wavelength that is not absorbed by the particle. The other laser is set at a wavelength tuned to provide maximum energy to the particle, which is a wavelength that is absorbed by the particle. These can each be switched on/off using the gate array described previously. The first laser acts to generate force on the particles, moving it to the desired location. The second laser acts to heat the particle, allowing it to be melted and fused into place once it has been located correctly. This can be done simultaneously, heating and moving to reduce operating time on each particle.

Particles are introduced through microchannels located near to the structure being built, in order to reduce distance of travel for each particle. This is the limiting factor in terms of volumetric printing rate. A large number of microchannels may be used to transport different materials into the working volume simultaneously. Multiple sizes of particles and types of materials may be introduced to the system, then the lasers bring these particles to the desired location. By altering the size of the particles, the volumetric printing rate may be increased in areas where feature resolution is not critical.

The whole printing operation is observed in real time through a microscope placed above the working volume. This allows for optical feedback in operation, as well as confirmation of the structure fabrication. The anticipated structure would operate with roughly 2 arrays of 2500 mirrors, each capable of 10 kHz bandwidths. This device is under development at present. The two arrays would provide 5000 mirrors, with 2 mirrors used to form each tweezer.

Although the description above contains many details and specifics, these should not be construed as limiting the scope of the invention but as merely providing illustrations of some of the presently preferred embodiments of this invention. Other implementations, enhancements and variations can be made based on what is described and illustrated in this patent document. The features of the embodiments described herein may be combined in all possible combinations of methods, apparatus, modules, systems, and computer program products. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination. Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described above should not be understood as requiring such separation in all embodiments.

Therefore, it will be appreciated that the scope of the present invention fully encompasses other embodiments which may become obvious to those skilled in the art. In the claims, reference to an element in the singular is not intended to mean "one and only one" unless explicitly so stated, but rather "one or more." All structural and functional equivalents to the elements of the above-described preferred embodiment that are known to those of ordinary skill in the art are expressly incorporated herein by reference and are intended to be encompassed by the present claims. Moreover, it is not necessary for a device to address each and every problem sought to be solved by the present invention, for it to be encompassed by the present claims. Furthermore, no element or component in the present disclosure is intended to be dedicated to the public regardless of whether the element or component is explicitly recited in the claims. No claim element herein is to be construed under the provisions of 35 U.S.C. 112, sixth paragraph, unless the element is expressly recited using the phrase "means for."

We claim:

1. A flexure-based micro-array comprising:
a plurality of micro-assemblies, each comprising:
an object; and
at least three electrostatic actuation modules for tipping, tilting, and/or piston-actuating the object, each actuation module comprising:
a base with first and second electrodes electrically isolated from each other; an electrically conductive lever arm;
a first flexure bearing suspending the lever arm adjacent the first and second electrodes so that electrical activation of at least one of the first and second electrodes produces an electrostatic moment of force on the lever arm to resiliently bias the first flexure bearing and pivot the lever arm about a fulcrum, wherein the first flexure bearing comprises stabilizing flexures connecting the anchors to the lever arm at off-axis locations from the fulcrum to additionally constrain the lever arm; and
a second flexure bearing connecting the lever arm to the object at a connection location that is different from other connection locations of the other actuation modules so that pivoting the lever arm about the fulcrum induces the second flexure bearing to pivot the object about an object pivot axis defined between two of the other connection locations while the second flexure bearing decouples the lever arm from object displacements induced by two of the other actuation modules connected to the two other connection locations defining the object pivot axis,
wherein the plurality of micro-assemblies are arranged with the objects juxtaposed in a substantially 2D array.

2. The flexure-based micro-array of claim 1,
wherein the first flexure bearing comprises a pair of blade flexures arranged along the fulcrum as torsion hinges connecting the lever arm to anchors fixed relative to the base.

3. The flexure-based micro-array of claim 1,
wherein the second flexure bearing has a triangular truss-shape with a wide base connected to the lever arm and an apex connected to the object at the connection location.

4. The flexure-based micro-array of claim 3,
wherein the second flexure bearing comprises two wire flexures spaced from each other at the lever arm to form the wide base, and converging at the apex.

5. The flexure-based micro-array of claim 1,
wherein the second flexure bearing comprises an angled arm flexure having a first blade flexure horizontally cantilevered to the lever arm with a blade surface substantially orthogonal to the fulcrum, and a second blade flexure connected at one end to the first blade flexure and at an opposite end to the object at the connection location and with a blade surface substantially parallel to the fulcrum.

6. The flexure-based micro-array of claim 1,
wherein the lever arm has a first set of comb fingers on one of two lever arm sections divided by the fulcrum and a second set of comb fingers on the other one of the lever arm sections, and the first and second electrodes comprise comb fingers interdigitally positioned between the comb fingers of the first and second sets of comb fingers, respectively, of the lever arm.

7. The flexure-based micro-array of claim 6,
wherein for each of the first and second sets of comb fingers of the lever arm, the comb fingers are connected to adjacent comb fingers of the set across the finger ends.

8. The flexure-based micro-array of claim 6,
wherein for each of the first and second sets of comb fingers of the lever arm, the comb fingers are connected to adjacent comb fingers of the set across an opposite side of the lever arm from the base.

9. The flexure-based micro-array of claim 1,
wherein the object is a micro-mirror having a reflective surface with the actuation modules located on an opposite side thereof, and the plurality of micro-assemblies are arranged with the mirrors juxtaposed to form a substantially gapless micro-mirror array.

10. The flexure-based micro-array of claim 1,
wherein the object is a transmissive element for steering light transmitted therethrough by actuation of the lever arms.

11. The flexure-based micro-array of claim 1,
wherein the object has a hexagonal shape with each hexagonal side juxtaposed to a hexagonal side of an adjacent object to form a honeycomb-shaped micro-array.

12. The flexure-based micro-array of claim 1,
wherein the object has a body, and four blade flexures substantially co-planar to each other and peripherally extending from and alongside the body to respective anchor ends fixed relative to the base.

13. The flexure-based micro-array of claim 1,
wherein each micro-device assembly comprises three electrostatic actuation modules connected to the object at three different connection locations, with the lever arm of each actuation module having a substantially rhombus shape in radial arrangement with the other two substantially rhombus-shaped lever arms so that major axes of the lever arms intersect at equal angles to each other, and the fulcrums are along the respective minor axes.

14. The flexure-based micro-array of claim 13,
wherein the object is a hexagonal micro-mirror having a reflective surface with the actuation module located on an opposite side thereof, and the plurality of micro-assemblies are arranged so that each hexagonal side of the micro-mirror is juxtaposed to a hexagonal side of an adjacent micro-mirror to form a substantially gapless honeycomb-shaped micro-mirror array.

15. The flexure-based micro-array of claim 14,
wherein the first flexure bearing comprises: a pair of blade flexures arranged along the fulcrum as torsion hinges connecting the lever arm to anchors fixed relative to the base; and stabilizing flexures connecting the anchors to the lever arm at off-axis locations from the fulcrum to additionally constrain the lever arm.

16. The flexure-based micro-array of claim 14,
wherein the second flexure bearing has a triangular truss-shape with a wide base connected to the lever arm and an apex connected to the object at the connection location.

17. The flexure-based micro-array of claim 16,
wherein the second flexure bearing comprises two wire flexures spaced from each other at the lever arm to form the wide base, and converging at the apex.

18. The flexure-based micro-array of claim 14,
wherein the lever arm has a first set of comb fingers on one of two lever arm sections divided by the fulcrum and a second set of comb fingers on the other one of the lever arm sections, and the first and second electrodes comprise comb fingers interdigitally positioned between the comb fingers of the first and second sets of comb fingers, respectively, of the lever arm.

19. The flexure-based micro-array of claim 1,
wherein each micro-assembly comprises four electrostatic actuation modules connected to the object at four different connection locations, with the lever arm of each actuation module having a substantially trapezoid shape, and the fulcrums are parallel to and between the trapezoid bases of the respective lever arms.

20. The flexure-based micro-array of claim 19,
wherein the object is a square micro-mirror having a reflective surface with the actuation module located on an opposite side thereof and four blade flexures arranged substantially co-planar to each other and peripherally extending alongside the four sides of the micro-mirror to respective anchor ends fixed relative to the base, and the plurality of micro-assemblies are arranged so that each of the four sides of the square micro-mirror is juxtaposed to a side of an adjacent square micro-mirror to form a substantially gapless micro-mirror array.

21. The flexure-based micro-array of claim 20,
wherein the first flexure bearing comprises: a pair of blade flexures arranged along the fulcrum as torsion hinges connecting the lever arm to anchors fixed relative to the base; and stabilizing flexures connecting the anchors to the lever arm at off-axis locations from the fulcrum to additionally constrain the lever arm.

22. The flexure-based micro-array of claim 20,
wherein the second flexure bearing comprises an angled arm flexure having a first blade flexure horizontally cantilevered to the lever arm with a blade surface substantially orthogonal to the fulcrum, and a second blade flexure connected at one end to the first blade flexure and at an opposite end to the object at the connection location and with a blade surface substantially parallel to the fulcrum.

23. The flexure-based micro-array of claim 20,
wherein the lever arm has a first set of comb fingers on one of two lever arm sections divided by the fulcrum and a second set of comb fingers on the other one of the lever arm sections, and the first and second electrodes comprise comb fingers interdigitally positioned between the comb fingers of the first and second sets of comb fingers, respectively, of the lever arm.

24. A flexure-based micro-actuation device comprising:
an object; and
at least three electrostatic actuation modules for tipping, tilting, and/or piston-actuating the object, each actuation module comprising:
a base with, first and second electrodes electrically isolated from each other; an electrically conductive lever arm;
a first flexure bearing suspending the lever arm adjacent the first and second electrodes so that electrical activation of at least one of the first and second electrodes produces an electrostatic moment of force on the lever arm to resiliently bias the first flexure bearing and pivot the lever arm about a fulcrum, wherein the first flexure bearing comprises stabilizing flexures connecting the anchors to the lever arm at off-axis locations from the fulcrum to additionally constrain the lever arm; and
a second flexure bearing connecting the lever arm to the object at a connection location that is different from other connection locations of the other actuation modules so that pivoting the lever arm about the fulcrum induces the second flexure bearing to pivot the object about an object pivot axis defined between two of the other connection locations while the second flexure bearing decouples the lever arm from object displacements induced by two of the other actuation modules connected to the two other connection locations defining the object pivot axis.

\* \* \* \* \*